US008565275B2

(12) United States Patent
Pushkarsky et al.

(10) Patent No.: US 8,565,275 B2
(45) Date of Patent: Oct. 22, 2013

(54) MULTI-WAVELENGTH HIGH OUTPUT LASER SOURCE ASSEMBLY WITH PRECISION OUTPUT BEAM

(75) Inventors: Michael Pushkarsky, San Diego, CA (US); David F. Arnone, Mountain View, CA (US)

(73) Assignee: Daylight Solutions, Inc., San Diego, CA (US)

( * ) Notice: Subject to any disclaimer, the term of this patent is extended or adjusted under 35 U.S.C. 154(b) by 146 days.

(21) Appl. No.: 13/177,332

(22) Filed: Jul. 6, 2011

(65) Prior Publication Data

US 2012/0068001 A1 Mar. 22, 2012
US 2013/0221152 A9 Aug. 29, 2013

Related U.S. Application Data

(63) Continuation-in-part of application No. 12/427,364, filed on Apr. 21, 2009, now Pat. No. 8,306,077.

(60) Provisional application No. 61/048,764, filed on Apr. 29, 2008, provisional application No. 61/362,207, filed on Jul. 7, 2010.

(51) Int. Cl.
*H01S 3/13* (2006.01)

(52) U.S. Cl.
USPC ............... 372/32; 327/4; 327/23; 327/100; 327/102

(58) Field of Classification Search
USPC .......................... 372/4, 23, 32, 100
See application file for complete search history.

(56) References Cited

U.S. PATENT DOCUMENTS 2,684,015 A 7/1954 Grey
4,470,662 A 9/1984 Mumzhiu
4,555,627 A 11/1985 McRae, Jr.
(Continued)

FOREIGN PATENT DOCUMENTS

DE 10205310 A1 9/2003
EP 0855587 A2 7/1998
(Continued)

OTHER PUBLICATIONS

PCT/US2011/028780 (related to present application) filed Mar. 17, 2011, Daylight Solutions, Inc. PCT International Application No. PCT/US2011/028780 and its entire prosecution history.
(Continued)

*Primary Examiner* — Dung Nguyen
(74) *Attorney, Agent, or Firm* — Roeder & Broder LLP

(57) ABSTRACT

A laser source assembly (210) for generating an assembly output beam (212) includes a first laser source (218A), a second laser source (218B), and a dispersive beam combiner (222). The first laser source (218A) emits a first beam (220A) having a first center wavelength, and the second laser source (218B) emits a second beam (220B) having a second center wavelength that is different than the first center wavelength. The dispersive beam combiner (222) includes a common area 224 that combines the first beam (220A) and the second beam (220B) to provide the assembly output beam (212). The first beam (220A) impinges on the common area (224) at a first beam angle (226A), and the second beam (220B) impinges on the common area (224) at a second beam angle (226B) that is different than the first beam angle (226A). Further, the beams (220A) (220B) that exit from the dispersive beam combiner (222) are substantially coaxial, are fully overlapping, and are co-propagating.

27 Claims, 10 Drawing Sheets

(56) References Cited

U.S. PATENT DOCUMENTS

| | | | |
|---|---|---|---|
| 4,656,641 A | 4/1987 | Scifres et al. |
| 4,737,028 A | 4/1988 | Smith |
| 4,745,276 A | 5/1988 | Broicher et al. |
| 4,772,789 A | 9/1988 | Maram et al. |
| 4,796,266 A | 1/1989 | Banwell et al. |
| 4,852,956 A | 8/1989 | Kramer |
| 4,871,916 A | 10/1989 | Scott |
| 5,005,934 A | 4/1991 | Curtiss |
| 5,050,176 A | 9/1991 | Naito et al. |
| 5,064,988 A | 11/1991 | E'nama et al. |
| 5,068,867 A | 11/1991 | Hasenberg et al. |
| 5,082,339 A | 1/1992 | Linnebach |
| 5,082,799 A | 1/1992 | Holmstrom et al. |
| 5,140,599 A | 8/1992 | Trutna, Jr. et al. |
| 5,161,408 A | 11/1992 | McRae et al. |
| 5,172,390 A | 12/1992 | Mooradian |
| 5,181,214 A | 1/1993 | Berger et al. |
| 5,225,679 A | 7/1993 | Clarke et al. |
| 5,255,073 A | 10/1993 | Wallin et al. |
| 5,264,368 A | 11/1993 | Clarke et al. |
| 5,267,016 A * | 11/1993 | Meinzer et al. ............ 356/498 |
| 5,315,436 A | 5/1994 | Lowenhar et al. |
| 5,331,651 A | 7/1994 | Becker et al. |
| 5,430,293 A | 7/1995 | Sato et al. |
| 5,457,709 A | 10/1995 | Capasso et al. |
| 5,491,714 A | 2/1996 | Kitamura |
| 5,523,569 A | 6/1996 | Hornfeld et al. |
| 5,537,432 A | 7/1996 | Mehuys et al. |
| 5,656,813 A | 8/1997 | Moore et al. |
| 5,662,819 A | 9/1997 | Kadomura |
| 5,751,830 A | 5/1998 | Hutchinson |
| 5,752,100 A | 5/1998 | Schrock |
| 5,780,724 A | 7/1998 | Olender et al. |
| 5,824,884 A | 10/1998 | Olender et al. |
| 5,834,632 A | 11/1998 | Olender et al. |
| 5,854,422 A | 12/1998 | McKeon et al. |
| 5,862,162 A | 1/1999 | Maeda |
| 5,866,073 A | 2/1999 | Sausa et al. |
| 6,089,076 A | 7/2000 | Mueller et al. |
| 6,134,257 A | 10/2000 | Capasso et al. |
| 6,154,307 A | 11/2000 | Veronesi et al. |
| 6,157,033 A | 12/2000 | Chudnovsky |
| 6,192,064 B1 | 2/2001 | Algots et al. |
| 6,212,310 B1 | 4/2001 | Waarts et al. |
| 6,243,404 B1 | 6/2001 | Joyce |
| 6,326,646 B1 | 12/2001 | Baillargeon et al. |
| 6,327,896 B1 | 12/2001 | Veronesi et al. |
| 6,400,744 B1 | 6/2002 | Capasso et al. |
| 6,470,036 B1 | 10/2002 | Bailey et al. |
| 6,483,978 B1 | 11/2002 | Gao et al. |
| 6,526,079 B1 * | 2/2003 | Watterson et al. .............. 372/32 |
| 6,553,045 B2 | 4/2003 | Kaspi |
| 6,575,641 B2 | 6/2003 | Yamabayashi et al. |
| 6,608,847 B2 | 8/2003 | Wang et al. |
| 6,636,539 B2 | 10/2003 | Martinsen |
| 6,690,472 B2 | 2/2004 | Kulp et al. |
| 6,782,162 B2 | 8/2004 | Fukuzawa et al. |
| 6,803,577 B2 | 10/2004 | Edner et al. |
| 6,856,717 B2 | 2/2005 | Kilian |
| 6,859,481 B2 | 2/2005 | Zheng |
| 6,866,089 B2 | 3/2005 | Avila |
| 6,885,965 B2 | 4/2005 | Butler et al. |
| 6,909,539 B2 | 6/2005 | Korniski et al. |
| 6,995,846 B2 | 2/2006 | Kalayeh et al. |
| 7,032,431 B2 | 4/2006 | Baum et al. |
| 7,061,022 B1 | 6/2006 | Pham et al. |
| 7,088,076 B2 | 8/2006 | Densham et al. |
| 7,151,787 B2 | 12/2006 | Kulp et al. |
| 7,189,970 B2 | 3/2007 | Racca et al. |
| 7,265,842 B2 | 9/2007 | Paldus et al. |
| 7,345,277 B2 | 3/2008 | Zhang |
| 7,358,498 B2 | 4/2008 | Geng et al. |
| 7,424,042 B2 | 9/2008 | Day et al. |
| 7,429,734 B1 | 9/2008 | Tidwell |
| 7,466,734 B1 | 12/2008 | Day et al. |
| 7,492,806 B2 | 2/2009 | Day et al. |
| 7,535,656 B2 | 5/2009 | Day et al. |
| 7,535,936 B2 | 5/2009 | Day et al. |
| 7,590,316 B2 | 9/2009 | Dames |
| 7,623,234 B2 | 11/2009 | Puzey |
| 7,732,767 B2 | 6/2010 | Houde-Walter |
| 7,733,925 B2 | 6/2010 | Pushkarsky et al. |
| 7,755,041 B2 | 7/2010 | Killinger et al. |
| 7,796,341 B2 | 9/2010 | Day et al. |
| 7,818,911 B2 | 10/2010 | Houde-Walter |
| 7,826,503 B2 | 11/2010 | Day et al. |
| 7,848,382 B2 | 12/2010 | Weida et al. |
| 7,873,094 B2 | 1/2011 | Day et al. |
| 7,920,608 B2 | 4/2011 | Marsland, Jr. et al. |
| 8,306,077 B2 | 11/2012 | Pushkarsky et al. |
| 2002/0024979 A1 | 2/2002 | Vilhelmsson et al. |
| 2002/0064198 A1 | 5/2002 | Koizumi |
| 2002/0090013 A1 | 7/2002 | Murry et al. |
| 2002/0105699 A1 | 8/2002 | Miracky et al. |
| 2002/0150133 A1 | 10/2002 | Aikiyo et al. |
| 2002/0176473 A1 | 11/2002 | Mouradian |
| 2003/0043877 A1 | 3/2003 | Kaspi |
| 2003/0063633 A1 | 4/2003 | Zhang et al. |
| 2003/0095346 A1 | 5/2003 | Nasu et al. |
| 2003/0123495 A1 | 7/2003 | Cox |
| 2003/0174315 A1 | 9/2003 | Byren et al. |
| 2003/0179789 A1 | 9/2003 | Pilgrim et al. |
| 2003/0193974 A1 | 10/2003 | Frankel et al. |
| 2003/0198274 A1 | 10/2003 | Lucchetti |
| 2004/0013154 A1 | 1/2004 | Zheng |
| 2004/0032891 A1 | 2/2004 | Ikeda et al. |
| 2004/0095579 A1 | 5/2004 | Bisson et al. |
| 2004/0165640 A1 | 8/2004 | Clifford et al. |
| 2004/0208602 A1 | 10/2004 | Plante |
| 2004/0228371 A1 | 11/2004 | Kolodzey et al. |
| 2004/0238811 A1 | 12/2004 | Nakamura et al. |
| 2004/0264523 A1 | 12/2004 | Posamentier |
| 2005/0083568 A1 | 4/2005 | Nakae et al. |
| 2005/0105566 A1 | 5/2005 | Sacher |
| 2005/0124869 A1 * | 6/2005 | Hefti et al. ............ 600/316 |
| 2005/0199869 A1 | 9/2005 | Shi |
| 2005/0213627 A1 | 9/2005 | Masselink et al. |
| 2005/0237524 A1 | 10/2005 | Kamei et al. |
| 2006/0056466 A1 | 3/2006 | Belenky et al. |
| 2006/0214107 A1 | 9/2006 | Mueller |
| 2006/0262316 A1 | 11/2006 | Baney |
| 2006/0268947 A1 | 11/2006 | Kalayeh |
| 2007/0019702 A1 | 1/2007 | Day et al. |
| 2007/0030865 A1 | 2/2007 | Day et al. |
| 2007/0047599 A1 | 3/2007 | Wysocki et al. |
| 2007/0165682 A1 | 7/2007 | He et al. |
| 2007/0291804 A1 | 12/2007 | Day et al. |
| 2008/0075133 A1 | 3/2008 | Day et al. |
| 2008/0231719 A1 | 9/2008 | Benson et al. |
| 2008/0298406 A1 | 12/2008 | Day et al. |
| 2008/0304524 A1 | 12/2008 | Marsland et al. |
| 2009/0015914 A1 | 1/2009 | Duncan et al. |
| 2009/0159798 A1 | 6/2009 | Weida et al. |
| 2009/0213882 A1 | 8/2009 | Day et al. |
| 2009/0257709 A1 | 10/2009 | Dames |
| 2009/0262768 A1 | 10/2009 | Day et al. |
| 2010/0110198 A1 | 5/2010 | Larson et al. |
| 2010/0132581 A1 | 6/2010 | Day et al. |
| 2010/0229448 A1 | 9/2010 | Houde-Walter et al. |
| 2010/0243891 A1 | 9/2010 | Day et al. |
| 2011/0006229 A1 | 1/2011 | Day et al. |
| 2011/0222566 A1 | 9/2011 | Weida et al. |

FOREIGN PATENT DOCUMENTS

| | | |
|---|---|---|
| EP | 0 877 454 A1 | 11/1998 |
| EP | 0 883 220 A2 | 12/1998 |
| EP | 1359686 A2 | 11/2003 |
| EP | 2 081 265 A3 | 9/2009 |
| EP | 2113975 A2 | 11/2009 |
| GB | 2286901 A | 8/1995 |
| JP | 55087107 A | 7/1980 |
| JP | 58072108 | 4/1983 |
| JP | 03-048480 A | 3/1991 |

(56) References Cited

FOREIGN PATENT DOCUMENTS

| JP | 07-024322 B | 1/1995 |
|---|---|---|
| JP | 2005317819 A | 11/2005 |
| WO | WO9220127 A1 | 11/1992 |
| WO | WO93/21843 A1 | 11/1993 |
| WO | WO 03/067720 A2 | 8/2003 |
| WO | WO2006045303 A2 | 5/2006 |
| WO | WO2008036881 A2 | 3/2008 |
| WO | WO2008036884 A2 | 3/2008 |

OTHER PUBLICATIONS

PCT/US2011/43065 (related to present application) filed Jul. 6, 2011, Daylight Solutions, Inc. PCT International Application No. PCT/US2011/443065 and its entire prosecution history.

PCT Notification of Transmittal of International Search Report and Written Opinion for PCT Application No. PCT/US2011/043065 (related to the present application), as mailed on Sep. 26, 2011, Daylight Solutions, Inc.

Oleksiy Andrusyak et al., External and common-cavity high spectral density beam combining of high power fiber lasers, Jan. 1, 2008, Proc. of SPIE vol. 6873, SPIE Digital Library.

Thomas Schreiber et al., Incoherent Beam Combining of Continuous-Wave and Pulsed Yb-Doped Fiber Amplifiers, Mar. 1, 2009, vol. 15, No. 2, © 2009 IEEE.

Weida et al., Utilizing broad gain bandwidth in quantum cascade devices, Nov. 2010, vol. 49 (11) Optical Engineering, 111120, 0091-3286/2010 © 2010 SPIE.

File:LED, 5mm, green (en).svg-Wikipedia, the free encyclopedia, Description English: A labeled drawing of a 5mm round (the "normal" type) LED. Apr. 6, 2009, 3 pages, http://en.wikipedia.org/wiki/File:LED,_5mm,_green(en).svg.

Martini, Ranier et al.,"High duty cycle operation of quantum cascade lasers based on graded superlattice active regions,"Journal of Applied Physics, Jun. 15, 2001, pp. 7735-7738,vol. 89, No. 12, XP012052642 ISSN:0021-8979, © 2001 American Institute of Physics.

Sitori, Carlo et al.,"Mid-Infrared (8.5 μm) Semiconductor Lasers Operating at Room Temperature," IEEE Photonics Technology Letters, Mar. 1997, pp. 297-299, vol. 9, No. 3, XP000684396, ISN:1041-1135, © 1997 IEE.

W.Y. Oh et al, "115 kHz tuning repetition rate ultrahigh-speed wavelength-swept semiconductor laser", accepted Aug. 9, 2005, pp. 3159-3163, vol. 30, No. 23, Optics Letters, © 2005 Optical Society of America.

Weida et al.,"Tunable QC laser opens up mid-IR sensing applications," Jul. 2006, pp. 1-5, Laser Focus World, http://www.optoiq.com/index/photonics-technologies-applications/lfw-display/lfw-articles-tools-template/_pr....

G.P. Luo et al.,Grating-tuned external-cavity quantum-cascade semiconductor lasers, May 7, 2001, Applied Physics Letters, vol. 78, No. 19, © 2001 American Institute of Physics.

G. Wysocki et al.,Widely tunable mode-hop free external cavity quantum cascade laser for high resolution spectroscopic applications, Jul. 27, 2005, Applied Physics, B81, pp. 769-777, Applied Physics B Lasers and Optics.

Day et al., Miniaturized External Cavity Quantum Cascade Lasers for Broad Tunability in the Mid-Infrared, May 21, 2006, 1-55752-813-6, Lasers and Electro-Optics and 2006 Quantum Electronics and Laser Science Conference, © 2006 IEEE.

G. Totschig et al.,Mid-infrared external-cavity quantum-cascade laser XP-001161786, Oct. 15, 2002, pp. 1788-1790, Optics Letters/vol. 27, No. 20, © 2002 Optical Society of America.

Thierry Aellen et al., Continuous-wave distributed-feedback quantum-cascade lasers on a Peltier cooler, Sep. 8, 2003, pp. 1929-1931, Applied Physics Letters, vol. 83, No. 10, © 2003 American Institute of Physics.

D. Weidmann et al., Development of a compact quantum cascade laser spectrometer for field measurements of CO 2 isotopes, Feb. 1, 2005, pp. 255-260, Applied PhysicsB, Lasers and Optics, Appl. Phys. B 80, published online: Sep. 29, 2004 © Springer-Verlag 2004.

Cassidy et al., Short-external-cavity module for ehanced single-mode tuning of InGaAsP and AlGaAs semiconductor diode lasers, Oct. 1991, No. 10, pp. 2385-2388, © 1991 American Institute of Physics.

M.G. Littman, H.J. Metcalf: "Spectrally narrow pulse dye laser without beam expander" Applied Optics, vol. 17, No. 14, Jul. 15, 1978, pp. 2224-2227, XP002528173 US.

Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, © 1985 Optical Society of America.

Victor Rudometov and Eugene Rudometrov, Peltier Coolers, May 11, 2005, pp. 1-11, http://www.digit-life.com /article/peltiercoolers.com/ © Digit-Life.com 1997-2004.

T Topfer, KP Petrov, Y Mine, D Jundt, RF Curl, and FK Tittel, Room-temperature mid-infrared laser sensor for trace gas detection, Applied Optics, Oct. 20, 1997, pp. 8042-8049, vol. 36 No. 30, Oct. 20, 1997/Applied Optics.

Cavity Enhancing Sensors using QC Lasers, Jun. 7, 2005, pp. 1-6, http://www.infrared.phl.gov/enhanced.sensors.html, Webmaster: Pamela Kinsey, Reviewed: Nov. 23, 2004.

Transient FM Absorption Spectroscopy, Jun. 7, 2005, pp. 1 and 2, http://www.chem/tamu.edu/group/north/FM.html.

FM Spectroscopy With Tunable Diode Lasers, Application Note 7, pp. 1-10, New Focus Copyright 2001.

John Andrews and Paul Dalin,Frequency Modulation Spectroscopy, Dec. 2005, pp. 24-26, http://www.spectroscopyeurope.com.

R.F. Curl and F.K. Tittel,Tunable infrared laser spectroscopy, 1998, pp. 219-272, Annu. Rep. Prog-Chem. Sect. C, 2002.

Shawn Wehe et al., AIAA 2002-0824 Measurements of Trace Pollutants in Combustion Flows Using Room-Temperature, Mid-IR Quantum Cascade Lasers , S. Wehe, et al. (Physical Sciences, Inc.) C Gmachi and F Capasso (Bell Lab., Lucent Technologies), Jan. 2002, cover and pp. 1-7, 40th AIAA Aerospace Sciences Meeting and Exhibit 14, Jan. 17, 2002, Reno, NV.

W. Huang, RRA Syms, J. Stagg and A.A. Lohmann, Precision MEMS Flexure mount for a Littman tunable external cavity laser, Mar. 2004, pp. 67-75, IEE Prc-Sci Meas. Technol vol. 151, No. 2 Mar. 2004.

K. Namjou, S. Cai, E.A. Whitaker, J. Faist, C. Gmacahi, F. Capasso, D.L. Sivco and A.Y. Cho,Sensitive absorption spectroscopy with a room-temperature distributed-feedback quantum-cascade laser, 1998, pp. 219-221, 1998 Optical Society of America.

Gregory E. Hall and Simon W. North,Transient Laser Frequency Modulation Spectroscopy, 2000, pp. 243-274, Annu. Rev.Phys. Chem. 2000.51:243-74—Copyright 2000.

External-cavity quantum-cascade lasers, May 11, 2005, pp. 1-4, http://www.unine.ch/phys/meso/EC/EC.html.

Frequency stabilization of diode lasers, May 30, 2005, pp. 1-17, Santa Chawla—National Physical Laboratory, http://www.ias.ac.in/currsci/jan25/articles41.htm, National Physical Lab, New Delhi 110 012 India.

R.A. Syms, A. Lohmann, MOEMS Tuning Element for a Littrow External Cavity Laser, Dec. 2003, pp. 921-928, Journal of Microelectromechanical Systems, vol. 12, No. 6 Dec. 2003.

A.A. Koserev et al., Thermoelectrically cooled quantum cascade laser based sensor for continuous monitoring of ambient atmospheric CO—AA Koserev, FK Tittel, R Kohler, C Gmachi, F Capasso, DL Sivco, AY Cho, S Wehe and M Allen, 2002, cover and pp. 1-16, Copyright 2002 Optical Society of America.

Cooke, M., Producing more light than heat from quantum cascade lasers, published on-line Jan. 10, 2010, http://www.semiconductor-today.com, Semiconductor Today, vol. 5, Issue 1, pp. 106-107, Feb. 2010.

Lincoln Laboratory, News, MIT Lincoln Laboratory creates bright diode lasers, posted on-line Oct. 2009, pp. 1-2, MIT Lincoln Laboratory:News: MIT Lincoln Laboratory creates bright diode lasers, http://www.ll.mit.edu/news/diodelaser.html, © 2011 Lincoln Laboratory, Massachusetts Institute of Technology.

Lincoln Laboratory, Publications, Lab Notes, Laser Technology, A Bright Idea, Simple tweaks turn into tiny diode lasers into powerhouses, posted on-line Jun. 2010, pp. 1-3, MIT Lincoln

(56) References Cited

OTHER PUBLICATIONS

Laboratory:Lab Note: A Bright Idea, http://www.ll.mit.edu/publications/labnotes/brightidea.html, © 2011 Lincoln Laboratory, Massachusetts Institute of Technology.

Hildebrandt, L.et al.."Quantum cascade external cavity and DFB laser systems in the mid-infrared spectral range: devices and applications," 2004, Sacher Lasertechnik Group, Marburg, Germany.

Haim Lotem, Mode-hop suppression of Littrow grating-tuned lasers: comment, 20 Month 1994, p. 1, vol. 33, No. 00, Applied Optics.

Corrie David Farmer, "Fab and Eval. of QCL's", Sep. 2000, Faculty of Engineering, University of Glasgow, Glasgow, UK.

M. De Labachelerie and G. Passedat, Mode-hop suppression of Littrow grating-tuned lasers, Jan. 20, 1993, pp. 269-274, vol. 32, No. 3, Applied Optics, © 1993 Optical Society of America.

S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland.

Gaetano Scamarcio, Mid-IR and THz Quantum Cascade Lasers, 2005, Physics Dept., University of Bari, Bari Italy.

Gaetano Scamarcio et al., Micro-probe characterization of QCLs correlation with optical performance, APL 78, 1177 & APL 78, 2095 (2001), APL 2002, APL 2004, University of Bari, Bari Italy.

J. Faist, THz and Mid-IR Quantum cascade lasers, QM in space, Chatillon, Mar. 31, Science 2002, University of Neuchatel, EU Projects Answer/Teranova; Agilent, Funding Swiss National Science Foundation.

Joel M. Hensley, Recent Updates in QCL-based Sensing Applications, Sep. 5-10, 2006, Physical Sciences, Inc., Andover, MA, 2nd International Workshop on Quantum Cascade Lasers, Ostuni, Italy.

J.M. Hensley et al., Demonstration of an External Cavity Terahertz Quantum Cascade Laser, Copyright 2005, Optical Society of America, Washington, DC 20036.

Richard Maulini et al., Broadly tunable external cavity quantum-cascade lasers, 2005, University of Neuchatel, Neuchatel Switzerland.

Tsekoun, A. et al; "Improved performance of QCL's through a scalable, manufacturable epitaxial-side-down mounting process"; Feb. 2006.

Pushkarsky, M. et al.; "Sub-parts-per-billion level detection of NO2 using room temp. QCLs"; May 2006.

Wirtz, D. et al.; "A tuneable heterodyne infrared spectrometer"; Physikalisches Institut; University of Koln; Koln Germany Spectrochimica 2002.

Williams, B. et al.;"Terahertz QCLs and Electronics"; PhD-MIT 2003.

The International Bureau of WIPO, International Preliminary Report on Patentability mailed Jan. 17, 2013 for PCT/US2011/043065.

Stevenage, "Tuneable Mulitwavelength Semiconductor Laser with Single Fibre Output", Electronics Letters, vol. 27, No. 17, Aug. 15, 1991, pp. 1498-1499, the whole document, Figure 1.

US 7,733,928, 06/2010, Marsland, Jr. et al. (withdrawn)

\* cited by examiner

MULTI-WAVELENGTH HIGH OUTPUT LASER SOURCE ASSEMBLY WITH PRECISION OUTPUT BEAM

RELATED INVENTION

This application claims priority on U.S. Provisional Application Ser. No. 61/362,207, filed Jul. 7, 2010 and entitled "MULTI WAVELENGTH INFRARED LASER MODULE WITH NEAR-DIFFRACTION LIMITED OUTPUT". This application is a continuation in part of U.S. patent application Ser. No. 12/427,364 filed on Apr. 21, 2009 and entitled "High Output, Mid Infrared Laser Source Assembly", which is issued under U.S. Pat. No. 8,306,077 on Nov. 6, 2012, and which claims priority on U.S. Provisional Application No. 61/048,764 filed Apr. 29, 2008. As far as is permitted, the contents of U.S. application Ser. No. 12/427,364 and U.S. Provisional Application Ser. No. 61/362,207 are incorporated herein by reference.

BACKGROUND

Mid Infrared ("MIR") laser sources that produce a MIR wavelength output beam can be used in many fields such as, in medical diagnostics, pollution monitoring, leak detection, analytical instruments, homeland security, remote chemical sensing, and industrial process control. Recently, lasers have been used to protect aircraft from sophisticated heat-seeking missiles. Manufacturers are always searching for ways to improve efficiency, durability, and power output of lasers.

SUMMARY

The present invention is directed to a laser source assembly that generates an assembly output beam. In one embodiment, the laser source assembly includes a first laser source, a second laser source, and a dispersive beam combiner. The first laser source emits a first beam having a first center wavelength, and the second laser source emits a second beam having a second center wavelength that is different than the first center wavelength. The dispersive beam combiner includes a common area that combines the first beam and the second beam to provide the assembly output beam. In one embodiment, the first beam impinges on the common area at a first angle, and the second beam impinges on the common area at a second angle that is different than the first angle. Further, the beams that exit from the dispersive beam combiner are substantially coaxial, are fully overlapping, and are co-propagating. Moreover, in certain embodiments, the assembly output beam has a figure of merit $M^2$ that is less than approximately 1.2.

With the present design, multiple, moderate output power laser sources can be combined into multi-Watt module configurations that offer many practical benefits. For example, lower per-facet intensity translates into lower thermal stress on individual elements, providing much longer term system reliability. In addition, gain materials with lower power requirements can be manufactured with much higher yields, providing a dependable supply at lower costs. Further, the combined beams provide more power while preserving good spatial quality.

In one embodiment, each laser source is an external cavity laser. With this design, each of the laser sources can be individually tuned so that a specific center wavelength of each beam is different. In certain embodiments, each laser source has a similar design, and each laser source includes (i) a quantum cascade gain media that generates a beam in the mid to far infrared range, (ii) a wavelength dependent feedback assembly that can be tuned to select the desired wavelength of the beam, (iii) a temperature controller that controls the temperature of the gain media, and (iv) a cavity optical assembly positioned between the gain media and the wavelength dependent feedback assembly. With this design, each of the laser sources can generate a narrow linewidth, and accurately settable beam.

In one embodiment, the dispersive beam combiner includes a grating which combines the first beam and the second beam.

Additionally, the laser source assembly can include a third laser source that emits a third beam having a third center wavelength that is different than the first center wavelength and the second center wavelength. In this embodiment, the dispersive beam combiner combines the first beam, the second beam, and the third beam to provide the assembly output beam. Further, the third beam impinges on the common area of dispersive beam combiner at a third angle that is different than the first angle and the second angle.

The present invention is also directed to a method for generating an assembly output beam, comprising the steps of: (i) emitting a first beam with a first laser source, the first beam having a first center wavelength; (ii) emitting a second beam with a second laser source, the second beam having a second center wavelength that is different than the first center wavelength; and (iii) combining the first beam and the second beam with a dispersive beam combiner to provide the assembly output beam. In this embodiment, the first beam impinges on a common area of the dispersive beam combiner at a first angle, and the second beam impinges on the common area at a second angle that is different than the first angle. Further, the beams exiting from the dispersive beam combiner are substantially coaxial.

The present invention is also directed to a missile jamming system for jamming an incoming missile. In this embodiment, the missile jamming system includes the laser source assembly described herein directing the assembly output beam at the incoming missile.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
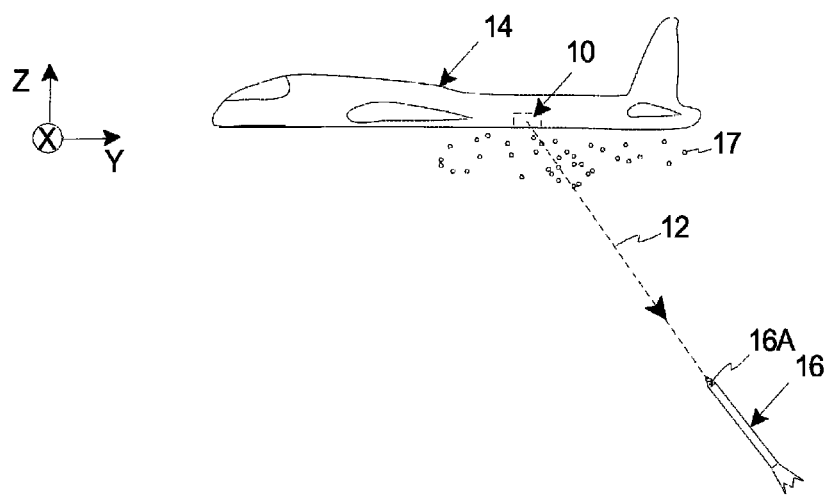
FIG. 1 is simplified side illustration of a missile, and an aircraft including a laser source assembly having features of the present invention.

FIG. 1 is simplified side illustration of a laser source assembly 10 (illustrated in phantom) having features of the present invention that generates an assembly output beam 12 (illustrated with a dashed arrow line). As an overview, in certain embodiments, the laser source assembly 10 includes multiple laser sources (not shown in FIG. 1) that each generates an accurately settable laser beam (not shown in FIG. 1), and the laser beams are coherently combined to create the assembly output beam 12 having a beam quality that is close to the beam quality of each of the individual laser beams. As a result thereof, multiple, laser sources with moderate output power can be combined into a multi-Watt module configuration that offers many practical benefits. For example, lower per-facet intensity translates into lower thermal stress on individual laser sources, providing much longer term system reliability. Further, the laser source assembly 10 can generate a powerful and precise output beam 12.

In certain embodiments, the multiple lasers sources are mounted on a common, thermally stabilized, and opto-mechanically stable assembly along with an integrated beam combining optics that coherently combine the outputs of the multiple, external cavity, lasers sources.

There are a number of possible usages for the laser source assembly 10 disclosed herein. For example, as illustrated in FIG. 1, the laser source assembly 10 can be used on an aircraft 14 (e.g. a plane or helicopter) to protect that aircraft 14 from a heat seeking missile 16. In this embodiment, the missile 16 is locked onto the heat emitting from the aircraft 14, and the laser source assembly 10 emits the assembly output beam 12 that protects the aircraft 14 from the missile 16. For example, the assembly output beam 12 can be directed at the missile 16 to jam the guidance system 16A (illustrated as a box in phantom) of the missile 16. In this embodiment, the laser source assembly 10 functions as a jammer of an anti-aircraft missile. With this design, the multiple laser sources can be accurately tuned to the appropriate wavelengths for jamming the guidance system 16A.

Alternatively, the laser source assembly 10 can be used in other applications. For example, the laser source assembly 10 can be used for a free space communication system in which the laser source assembly 10 is operated in conjunction with an IR detector located far away, to establish a wireless, directed, invisible data link. Still alternatively, the laser source assembly 10 can be used for any application requiring transmittance of directed infrared radiation through the atmosphere at the distance of thousands of meters, to simulate a thermal source to test IR imaging equipment, as an active illuminator to assist imaging equipment, or any other application.

In certain embodiments, an important aspect of the assembly output beam 12 is the ability propagate through the atmosphere 17 (illustrated as small circles) with minimal absorption. Typically, the atmosphere 17 absorption is mainly due to water and carbon dioxide. Atmospheric propagation requires narrow linewidth and accurate settable wavelength to avoid absorption. With the present invention, in certain embodiments, at least some of the laser sources generate a narrow linewidth laser beam that is in the mid to far infrared range, and these laser sources can be individually tuned so that each laser beam is at a wavelength that allows for maximum transmission through the atmosphere 17. Stated in another fashion, the wavelength of each laser beam can be specifically selected to avoid the wavelengths that are readily absorbed by water or carbon dioxide. Traditional methods for generating mid-infrared laser radiation can be complex, difficult to cool, not reliable, and often do not generate a beam with sufficient power.

A number of Figures include an orientation system that illustrates an X axis, a Y axis that is orthogonal to the X axis and a Z axis that is orthogonal to the X and Y axes. It should be noted that these axes can also be referred to as the first, second and third axes.

Figure 2:
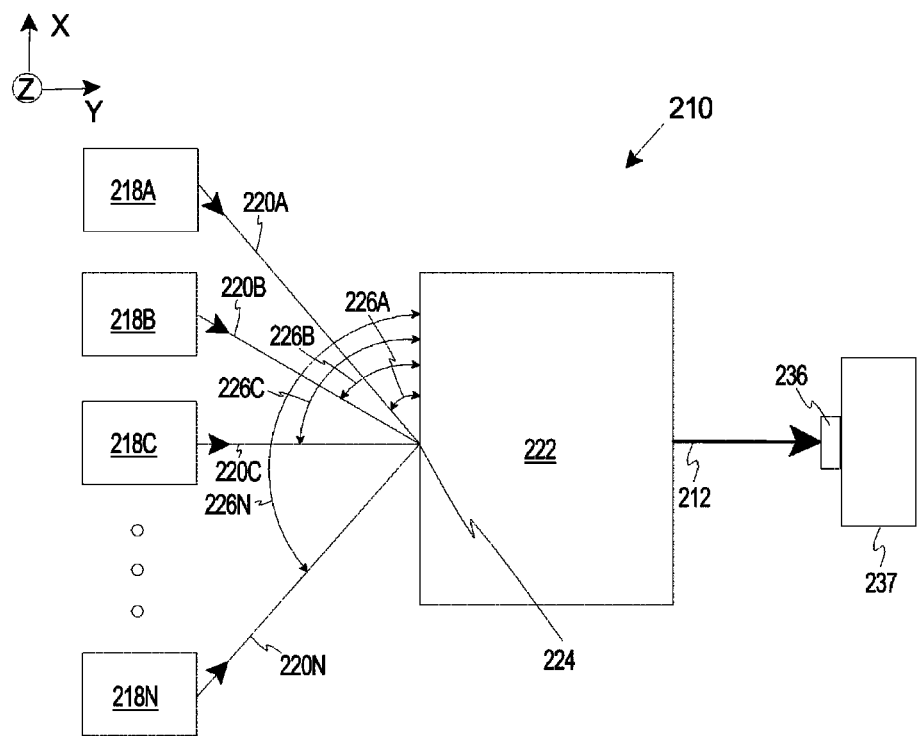
FIG. 2 is a simplified schematic of a laser source assembly having features of the present invention.

The design, size and shape of the laser source assembly 10 can be varied pursuant to the teachings provided herein. FIG. 2 is a simplified illustration of one embodiment of a laser source assembly 210 having features of the present invention. In FIG. 2, the laser source assembly 210 includes (i) multiple laser sources 218A, 218B, 218C, 218N that each generates a laser beam 220A, 220B, 220C, 220N, and (ii) a dispersive beam combiner 222 that combines the laser beams 220A, 220B, 220C, 220N into the spatial output beam 212 with minimal degradation of beam quality. In one embodiment, each of the laser sources 218A, 218B, 218C, 218N is designed and/or tuned so that its respective laser beam 220A, 220B, 220C, 220N has a relatively narrow spectral line-width and has a different center wavelength. Moreover, each of the laser beams 220A, 220B, 220C, 220N impinges on a common combiner area 224 of the dispersive beam combiner 222 at a different angle 226A, 226B, 226C, 226N. Further, in one embodiment, the dispersive beam combiner 222 diffracts the narrow spectral line-width laser beams 220A, 220B, 220C, 220N with various incident angles 226A, 226B, 226C, 226N into one common direction in a manner that all combined beams 220A, 220B, 220C, 220N spatially coincide into the co-propagating output beam 212 and all of the beams exiting from the dispersive beam combiner 222 are substantially coaxial. In the simplified example illustrated in FIG. 2, the dispersive beam combiner 222 is a transmissive, diffraction grating.

With the designs provided herein, the present invention provides the following benefits: 1) getting more power into the output beam 212 while preserving good spatial quality; and 2) providing different frequency pulses of light that travel down the exact same path (at the same time or not).

The number and design of the laser sources 218A, 218B, 218C, 218N can be varied to achieve the power and wavelength requirements for the assembly output beam 212. In FIG. 2, the laser source assembly 210 includes four separate laser sources 218A, 218B, 218C, 218N. Alternatively, the laser source assembly 210 can include more than four or fewer than four separate laser sources 218A, 218B, 218C, 218N. It should be noted that any of the laser sources 218A, 218B, 218C, 218N can be referred to as a first, second, third, etc laser source. Somewhat similarly, any of the laser beams 220A, 220B, 220C, 220N can be referred to as a first, second, third, etc laser source. Further, any of the beam angles 226A, 226B, 226C, 226N can be referred to as a first, second, third, etc beam angle.

In one embodiment, one or more of the laser sources 218A, 218B, 218C, 218N is an infrared laser source that generates a laser beam 220A, 220B, 220C, 220N having a center wavelength that is in the mid to far infrared wavelength range (3-30 um). Further, one or more of the laser sources 218A, 218B, 218C, 218N can be an electrically pumped semiconductor laser with its own external cavity for individually controlling the operating center wavelength and line-width of its laser beam 220A, 220B, 220C, 220N.

Further, in one embodiment, each of the laser sources 218A, 218B, 218C, 218N is individually tuned so that a specific center wavelength of the beams 220A, 220B, 220C, 220N of each of the laser sources 218A, 218B, 218C, 218N is different. Thus, the laser sources 218A, 218B, 218C, 218N can be tuned so that the assembly output beam 12 is a multiple wavelength (incoherent) output beam 212. As a result thereof, the characteristics (e.g. the wavelengths) of the assembly output beam 212 can be adjusted to suit the application for the laser source assembly 10.

As provided herein, the specific center wavelength of each of the beams 220A, 220B, 220C, 220N is also selected to correspond to its respective beam angle 226A, 226B, 226C, 226N. In this embodiment, the dispersive beam combiner 222 includes a diffraction grating. With this design, wavelength (or spectral) beam combining utilizes spatial coherence, rather than temporal coherence, to combine the laser beams 220A, 220B, 220C, 220N of different wavelength into the single output beam 212. More specifically, if a collimated laser beam 220A, 220B, 220C, 220N with multiple spectral lines impinges on a grating 222, the first-order diffracted beams from the grating 222 propagate in unique directions governed by the grating diffraction equation. With the present design, the laser source assembly 210 is designed and assembled so that the multiple beams 220A, 220B, 220C, 220N of unique wavelength and incident angle 226A, 226B, 226C, 226N impinge on a grating 222 such that they overlap at the grating surface 224. If the wavelengths and angles are chosen to satisfy the grating diffraction equation, then the first-order (or any other order of choice) of the diffracted beams 220A, 220B, 220C, 220N will emerge as one collinear beam 212 containing all the original wavelengths. One of the primary benefits of this design is that the output beam 212 quality is largely governed by the quality of the individual laser beams 220A, 220B, 220C, 220N.

It should be noted that with the present invention, the design (e.g. the shape and spacing of the elongated elements) of the grating can be designed to suit the different wavelengths and beam angles 226A-226N.

Figure 3:
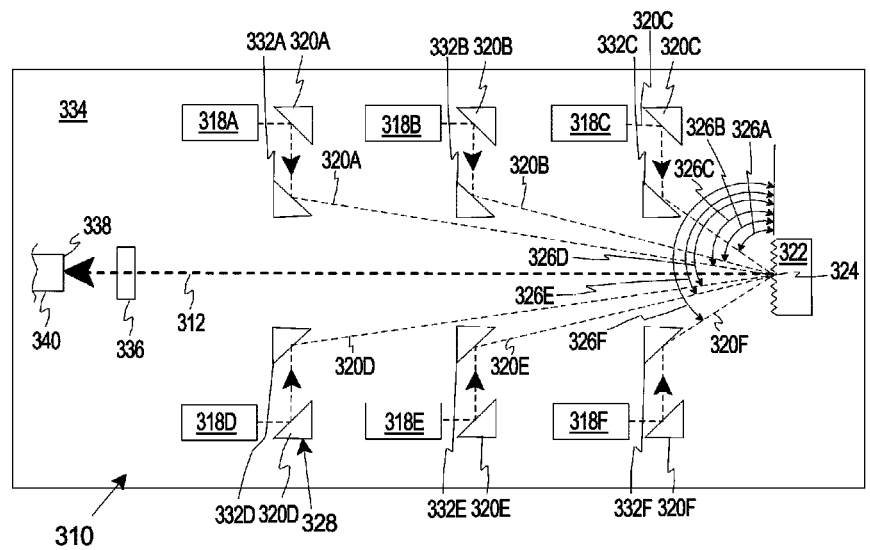
FIG. 3 is a simplified schematic of another embodiment of a laser source assembly having features of the present invention.

In FIG. 3, the combined beam 212 that is transmitted through the dispersive beam combiner 222 is directed at a lens assembly 236 that focuses the assembly output beam 212 onto an inlet of an optical switch 237. The optical switch 237 is described in more detail with reference to FIGS. 12A-12C.

FIG. 3 is a simplified illustration of another embodiment of a laser source assembly 310 having features of the present invention. In this embodiment, the laser source assembly 310 includes six separate laser sources 318A-318F, each generating a laser beams 320A-320F that is directed at the common dispersive beam combiner 322. In this embodiment, the laser source assembly 310 includes a beam director assembly 328 that redirects the laser beams 320A-320F so that the individual laser beams 320A-320F impinge at the desired different angles 326A-326F at the plane of the combiner common area 324 of the dispersive beam combiner 322 (e.g. a grating) and the laser beams 320A-320F are angled so that the assembly output beam 312 (the diffracted beams) co-propagate as they reflect off of and exit the dispersive beam combiner 322.

The design of the beam director assembly 328 can be varied to suit the desired layout of the laser source assembly 310. In FIG. 3, the beam director assembly 328 directs and steers the laser beams 320A-320F at the dispersive beam combiner 322. In this embodiment, the beam director assembly 328 directs each of the lasers beams 320A-320F so that their respective beam angle 326A-326F on the dispersive beam combiner 322 is different.

In one embodiment, for each laser source 318A-318F, the beam director assembly 328 can include a first beam director 330A-330F and a second beam director 332A-332F that is spaced apart from the first beam director 330A-330F. Further, each beam director 330, 332 can be a reflector (e.g. a beam steering prism) that includes a coating that reflects light in the wavelength of the respective laser beam 320A-320F. In FIG. 3, the beam director assembly 328 can include (i) the first beam director 330A and the second beam director 332A that cooperate to steer the first laser beam 320A to impinge at the desired first beam angle 326A on the combiner surface 324; (ii) the first beam director 330B and the second beam director 332B that cooperate to steer the second laser beam 320B to impinge at the desired second beam angle 326B on the combiner surface 324; (iii) the first beam director 330C and the second beam director 332C that cooperate to steer the third laser beam 320C to impinge at the desired third beam angle 326C on the combiner surface 324; (iv) the first beam director 330D and the second beam director 332D that cooperate to steer the fourth laser beam 320D to impinge at the desired fourth beam angle 326D on the combiner surface 324; (v) the first beam director 330E and the second beam director 332E that cooperate to steer the fifth laser beam 320E to impinge at the desired fifth beam angle 326E on the combiner surface 324; and (vi) the first beam director 330F and the second beam director 332F that cooperate to steer the sixth laser beam 320F to impinge at the desired sixth beam angle 326F on the combiner surface 324.

The materials utilized and the recipe for the coatings of each beam director 330A-332F can be varied according to the wavelengths of the beams 320A-320F. Suitable materials for the coatings include silicone, germanium, metal-oxides, and/or metal fluorides. Further, the recipe for each of the coatings can be developed using the commercially available coating design program sold under the name "The Essential Macleod", by Thin Film Center Inc., located in Tucson, Ariz.

It should be noted that one or more of the beam directors 330A-332F can be mounted to a mounting base 334 in a fashion that allows each beam directors 330A-332F to be accurately and individually moved and adjusted relative to the mounting base 334 and the beam combiner 322 about or along one or more axes. For example, each of the first beam directors 330A-330F can be a mirror mount that is adjustable in tip and tilt, and each of the second beam directors 332A-332F can be a mirror mount that is adjustable in the tip and tilt. With this design, the beam directors 330A-332F can be accurately moved to properly direct the respective beam 320A-320F at the beam combiner 322 at the desired beam angle 326A-326F for the respective wavelength of the beams 320A-320F. Further, with this design, each of the beams 320A-320F can be adjusted with four degrees of movement (two with the first beam director and two with the second beam director). Alternatively, the directors can be designed to adjust the beams with more than four or fewer than four degrees of movement.

In this design, the specific center wavelength of each of the beams 320A-320F is also selected to correspond to its respective beam angle 326A-326F to achieve the co-propagating output beam 312. In this embodiment, the dispersive beam combiner 322 includes a diffraction grating. With this design, wavelength (or spectral) beam combining utilizes spatial coherence to combine the laser beams 320A-320F of different wavelength into the single output beam 312. With the present design, the laser source assembly 310 is designed and assembled so that the multiple beams 320A-320F of unique wavelength and incident angle 326A-326F impinge and overlap on the grating. If the wavelengths and angles are chosen to satisfy the grating diffraction equation, then the first-order (or any other order of choice) of the diffracted beams 320A-320F will emerge as one collinear beam 312 containing all the original wavelengths.

Subsequently, in FIG. 3, the combined beam 312 that is reflected off of and exits the dispersive beam combiner 322 is directed at a lens assembly 336 that focuses the assembly output beam 312 onto a fiber facet 338 of the fiber 340. The design of the lens assembly 336 and the optical fiber 340 can be varied pursuant to the teachings provided herein. Alternatively, for example, the combined beam 312 can be directed a optical switch 237 (illustrated in FIG. 2).

In one embodiment, the lens assembly 336 is a spherical lens having an optical axis that is aligned and coaxial with the output beam 312. In one embodiment, to achieve the desired small size and portability, the lens assembly 336 has a relatively small diameter. In alternative, non-exclusive embodiments, the lens assembly 336 has a diameter of less than approximately 10 or 15 millimeters, and a focal length of approximately 1, 2, 3, 4, 5, 6, 7, 8, 9, 10, 11, 12, 13, 14, 15, 16, 17, 18, 19, 20, 21, 22, 23, 24 or 25 mm and any fractional values thereof. The lens assembly 336 can comprise materials selected from the group of Ge, ZnSe, ZnS Si, CaF, BaF or chalcogenide glass. However, other materials may also be utilized that are effective with the wavelengths of the beams 320A-320F. The lens assembly 336 may be spherical or aspherical. The lens assembly 336 can be designed to have numerical aperture (NA) which matches that of a fiber 340 and to have a clear aperture that matches the diameter of the output beam 312.

In one embodiment, the optical fiber 340 is multi-mode fiber that transmits the output beam 312. In certain embodiments, the fiber facet 338 (the inlet) of the optical fiber 340 includes an AR (anti-reflection) coating. The AR coating allows the output beam 312 to easily enter the fiber facet 338. This improves the efficiency of the coupling of the output beam 312 to the optical fiber 340, and reduces the amount of heat that is generated at the fiber facet 338. Further, the AR coating ensures that the majority of the power generated by the laser sources 318A-318F is transferred to the optical fiber 340. In one embodiment, the AR coating has a relatively low reflectivity in the MIR range. In alternative, non-exclusive embodiments, the AR coating can have a reflectivity of less than approximately 1, 2, 3, 4, or 5 percent at the MIR range.

In one embodiment, the lens assembly 336 and the optical fiber 340 are secured to the mounting base 334. It should be noted that it is important to obtain and maintain the precise relative position between the components of the laser source assembly 310.

In this embodiment, the individual laser sources 318A-318F are designed to provide near diffraction limited beams 320A-320F, and the incoherently combined beams 320A-320F will result in a more powerful and also near diffraction limited beam 312. As provided herein, the near diffraction limited property allows the focusing of the combined beam 312 into the fiber 340 with little loss.

Figure 4A:
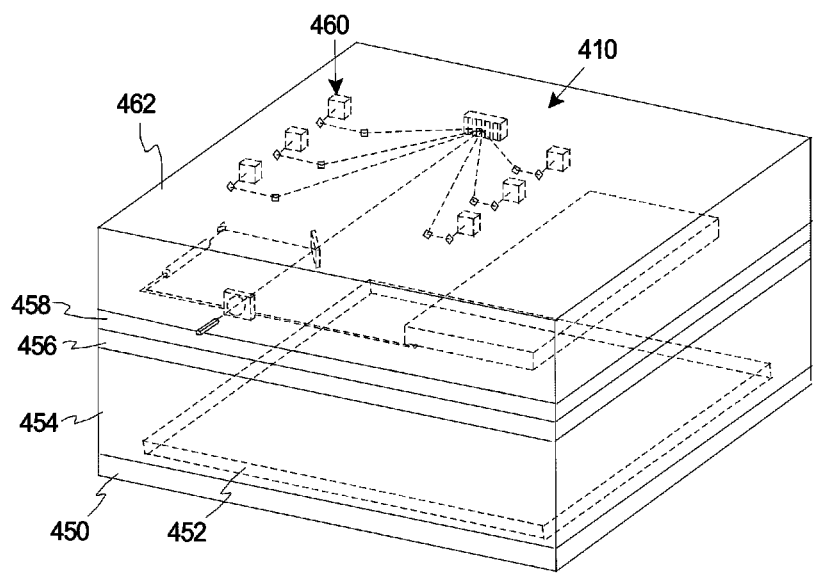
FIG. 4A is a simplified perspective view of still another embodiment of the laser source assembly having features of the present invention.

FIG. 4A is a simplified perspective illustration of yet another embodiment of the laser source assembly 410. In this embodiment, the laser source assembly 410 is generally rectangular shaped and includes a bottom cover 450, a system controller 452 (illustrated in phantom) that is stacked on the bottom cover 450, a thermal module 454 that is stacked on the system controller 452, an insulator 456 that is stacked on top of the thermal module 454, a mounting base 434 that is stacked on top of the insulator 456, a laser system 460 that is secured to the mounting base 434, and a cover 462 that covers the laser system 460. Alternatively, the laser source assembly 410 can be designed with more or fewer components than are illustrated in FIG. 4A and/or the arrangement of these components can be different than that illustrated in FIG. 4A. Further, the size and shape of these components can be different than that illustrated in FIG. 4A. It should be noted that the laser source 410 can be powered by a generator, e.g. the generator for the aircraft 14 (illustrated in FIG. 1), a battery, or another power source.

Figure 4B:
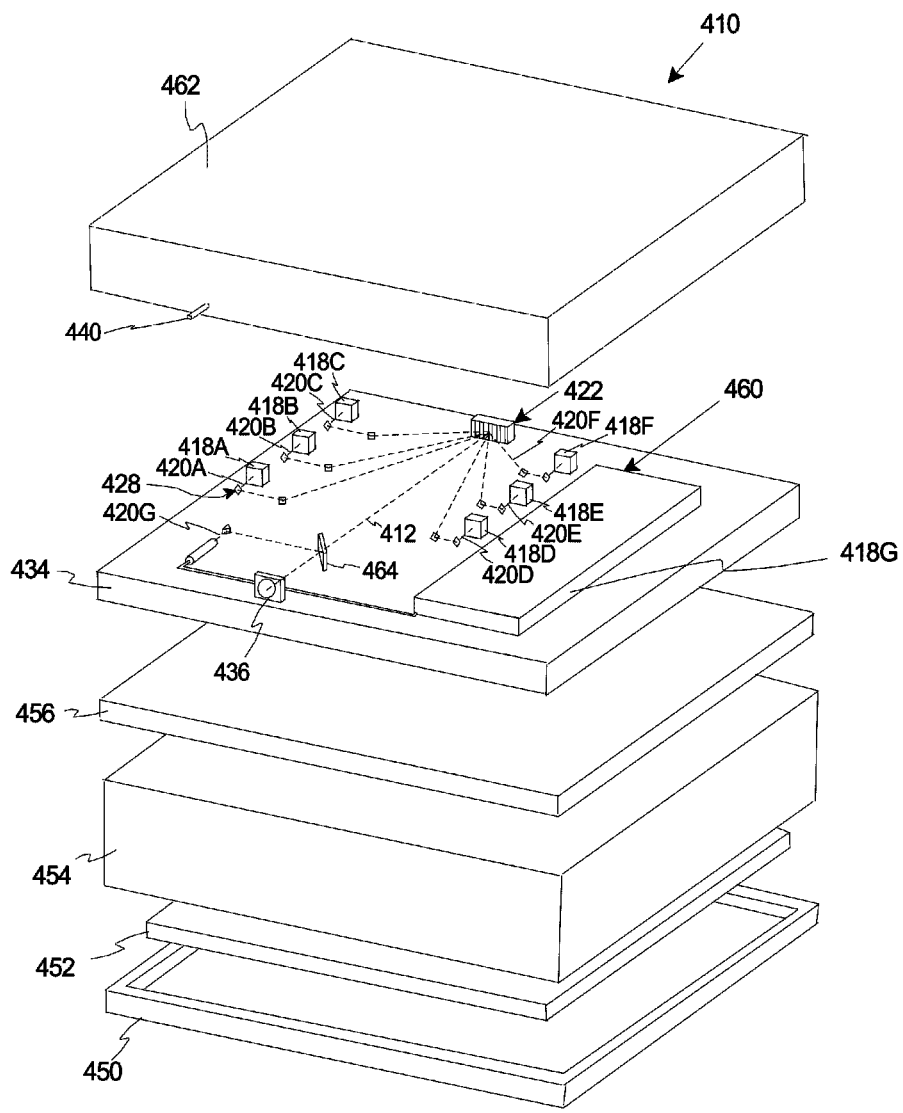
FIG. 4B is a simplified, partly exploded perspective view of the laser source assembly of FIG. 4A.

FIG. 4B is a simplified, partly exploded perspective view of the laser source assembly 410 of FIG. 4A, and the assembly output beam 412 (illustrated with a dashed line). In this embodiment, the bottom cover 450 is rigid, and is shaped somewhat similar to an inverted top to a box. Alternatively, the bottom cover 450 can have another suitable configuration.

The system controller 452 controls the operation of the thermal module 454 and the laser system 460. For example, the system controller 452 can include one or more processors and circuits. In certain embodiments, the system controller 452 can control the electron injection current to the individual laser sources 418A-418G of the laser system 460 and the temperature of the mounting base 434 and the laser system 460 to allow the user to remotely change the characteristics of the assembly output beam 412 (illustrated in FIG. 1).

In certain embodiments, the system controller 452 individually directs current to each of the laser sources 418A-418G. For example, the system controller 452 can continuously direct power to one or more of the laser sources 418A-418G. Alternatively, for example, the system controller 452 can direct power in a pulsed fashion to one or more of the laser sources 418A-418G. In one embodiment, the duty cycle is approximately fifty percent. Alternatively, the duty cycle can be greater than or less than fifty percent.

In one, non-exclusive embodiment, the system controller 452 pulses approximately 5-20 watts peak power (as opposed to constant power) to one or more of the laser sources 418A-418G in a low duty cycle wave form. With this design, the laser source 418A-418G lases with little to no heating of the core, the average power directed to the laser source 418A-418G is relatively low, and the desired average optical power of the output beam 412 can be efficiently achieved.

It should be noted that in the pulsed mode of operation, the system controller 452 can simultaneous direct pulses of power to each of the laser sources 418A-418G so that each of the laser sources 418A-418G generates the respective beam 420A-420G at the same time. Alternatively, the system controller 454 can direct pulses of power to one or more of the laser sources 418A-418G at different times so that the laser sources 418A-418G generate the respective beam 420A-420G at different times.

As provided herein, the system controller 452 can accept analog, digital or software transmitted commands to pulse the assembly output beam 412 with the desired pulse width and repetition rate. This feature allows the user to precisely adjust the characteristics of the assembly beam 412 to meet the system requirements of the laser source assembly 410.

The thermal module 454 controls the temperature of the mounting base 434 and the laser system 460. For example, the thermal module 454 can include a heater (not shown), a chiller (not shown), and a temperature sensor (not shown) e.g. a thermistor. In one embodiment, the temperature sensor provides feedback regarding the temperature of the mounting base 434, and the system controller 452 receives the feedback from the temperature sensor to control the operation of the thermal module 454. With this design, the thermal module 454 is used to directly control the temperature of the mounting base 434 so that the mounting base 434 is maintained at a predetermined temperature. In one non-exclusive embodiment, the predetermined temperature is approximately 25 degrees Celsius. By maintaining the mounting base 434 at a predetermined temperature, the thermal module 454 can be used to control the temperature of the components of the laser system 460.

In one embodiment, the thermal module 454 is designed to selectively circulate hot or cold circulation fluid (not shown) through the mounting base 434 to control the temperature of the mounting base 434. In this embodiment, the chiller and the heater can be used to control the temperature of the circulation fluid that is circulated in the mounting base 434. Alternatively, the thermal module 454 can be in direct thermal contact with the mounting base 434. Additionally, or alternatively, the thermal module 434 can also include one or more cooling fans and vents to further remove the heat generated by the operation of the laser source assembly 410.

In certain embodiments, the mounting base 434 provides a rigid, one piece platform to support the components of the laser system 460 and maintain the relative position of the components of the laser system 460. In one non-exclusive embodiment, the mounting base 434 is monolithic, and generally rectangular plate shaped, and includes a plurality of embedded base passageways (not shown) that allow for the circulation of the hot and/or cold circulation fluid through the mounting base 434. Non-exclusive examples of suitable materials for the mounting base 434 include magnesium, aluminum, and carbon fiber composite.

The cover 462 covers the laser system 460 and provides a controlled environment for the laser system 460. More specifically, the cover 462 can cooperate with the mounting base 434 to define a sealed laser chamber that encloses the laser sources 418A-418G. Further, an environment in the sealed laser chamber can be controlled. For example, the sealed laser chamber can be filled with an inert gas, or another type of fluid, or the sealed laser chamber can be subjected to vacuum. In one embodiment, cover 462 is rigid, and is shaped somewhat similar to an inverted top to a box. Moreover, in this embodiment, the laser beams 420A-420G travel in free space in the sealed laser chamber.

In FIG. 4B, the laser system 460 includes (i) seven individual laser sources 418A-418G that are fixedly secured to the mounting base 434, (ii) the dispersive beam combiner 422 that is similar to the corresponding component described above and illustrated in FIG. 3, (iii) the beam director assembly 428, (iv) a beam combiner 464; (v) a lens assembly 436 that is similar to the corresponding component described above and illustrated in FIG. 3; and (vi) an output fiber 440 that is similar to the corresponding component described above and illustrated in FIG. 3. Alternatively, for example, the output beam 412 can be directed to an optical switch (illustrated in FIG. 2) that is fixedly mounted to the laser source assembly 410.

In FIG. 4B, the beam director assembly 428 (i) redirects six of the laser beams 420A-420F so that the six individual laser beams 420A-420F impinge at the desired beam angle at the plane of the combiner common area 424 of the dispersive beam combiner 422 (e.g. the grating) so that the assembly output beam 412 (e.g. the diffracted beams) co-propagate as they reflect off of and exit the dispersive beam combiner 422; and (ii) directs one of the laser beam 420G at the beam combiner 464.

Figure 4C:
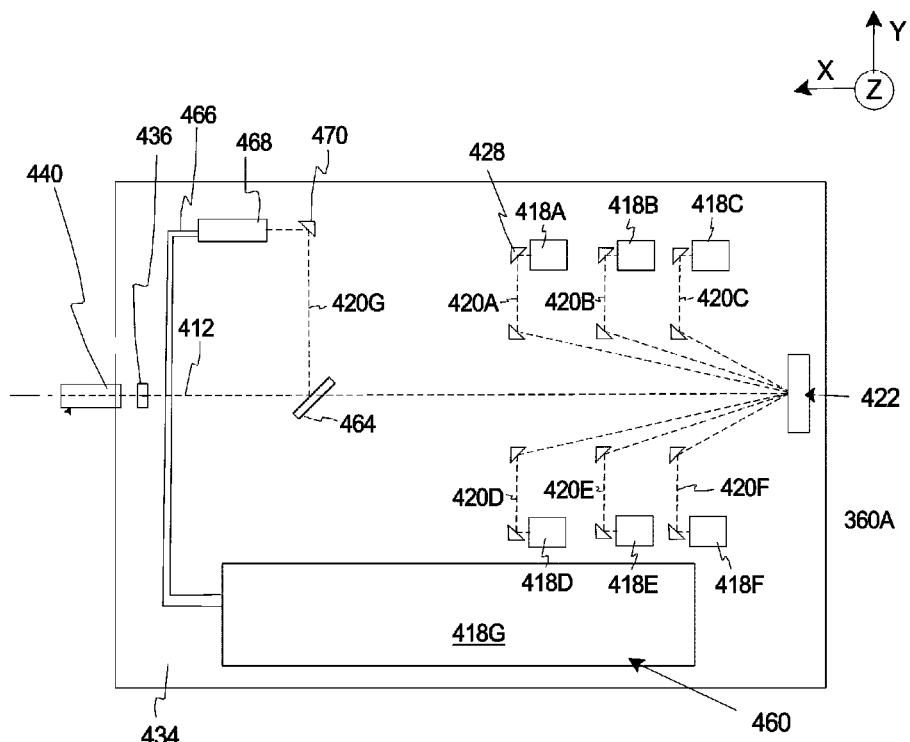
FIG. 4C is a top view of a portion of a laser source assembly of FIGS. 4A and 4B.

FIG. 4C is a simplified top view of the mounting base 434, and the seven laser sources 418A-418G of laser system 460. In this embodiment, six of the laser sources 418A-418F are similar in design, and the seventh laser source 418G is different. As one non-exclusive example, six of the laser sources 418A-418F can generate laser beams 420A-420F having a center wavelength in the mid to far infrared range (3-30 microns), and one of the laser sources 418G can generate a laser beam 420G having a center wavelength that is outside the mid to far infrared range.

Further, as provided herein, one or more the laser sources 418A-418G can be individually tuned so that a center wavelength of each laser source 418A-418G is different. With this design, the laser sources 418A-418G can be tuned so that the assembly output beam 412 is a multiple wavelength (incoherent) beam. As a result thereof, the characteristics (e.g. the wavelengths) of the assembly output beam 412 can be adjusted to suit the application for the laser source assembly 410. Further, the specific center wavelength of the six beams 420A-420F are also selected to correspond to its respective beam angle (not denoted in FIG. 4C) in which it impinges on the dispersive beam combiner 422. Moreover, the exact wavelengths contained in the output beam 412 can be selected so that the resulting assembly output beam 412 propagates through the atmosphere with minimal absorption.

One embodiment of a suitable laser source 418A-418F for generating the mid to far infrared beams 420A-420F is described in more detail below with reference to FIG. 6. Each of these laser sources 420A-420F can also be referred to as a Band 4 laser source. Further, it should also be noted that each of these six laser sources 418A-418F can generate a beam 420A-420F having a power of between approximately 0.5 and 3 watts. As a result thereof, the six laser sources 418A-418F can generate a combined power of between approximately three and eighteen watts.

One embodiment of a suitable other laser source 418G is a diode-pumped Thulium-doped fiber laser that generates a beam 420G having a center wavelength of approximately 2 microns. A suitable other laser source 418G can be purchased from IPG Photonics, located in Oxford, Mass. The other laser source 418G can also be referred to as a Band I laser source. In one embodiment, the other laser source 418G generates a beam 420G having a power of between approximately one to ten watts, and a linewidth of less than approximately 2.5 cm-1.

In this embodiment, for the six laser sources 418A-418F, the beam director assembly 428 can include a first beam director (not labeled in FIG. 4C) and a second beam director (not labeled in FIG. 4C) that are similar to the corresponding components described above and illustrated in FIG. 3.

Further, in this embodiment, for the other laser source 418G, the beam director assembly 428 can include a guiding optical fiber 466 that guides the beam 420G from the body of the laser source 418G, a fiber collimator 468 that collimates and launches the beam 420G, and a beam director 470 that directs the laser beam 420G at the beam combiner 464. For example, the beam director 470 can be a reflector (e.g. a beam steering prism) that includes a coating that reflects light in the wavelength of the beam 420G. Further, in one embodiment, the beam director 470 can direct the beam 420G at an angle of approximately ninety degrees relative to the output beam 412.

The beam combiner 464 can be a dichroic filter that is designed to be anti-reflective to light in the mid to far range while being highly reflective to light outside the mid to far infrared range (or the wavelength of the beam 420G). In this embodiment, the dichroic filter has a central axis that is coaxial with the beams exiting the dispersive beam combiner 422. For example, the dichroic filter 464 can include a coating that is anti-reflective to light in the mid to far infrared range, and reflective to light outside the mid to far infrared range. With this design, the beams 420A-420F are transmitted through the dichroic filter 464, and the beam 420G is reflected off of the dichroic filter 464.

It should be noted that with this design, the laser beam 420G is directed to be coaxial and co-propagating with the beams 420A-420F that exit the dispersive beam combiner 422 to create the output beam 412.

Figure 5:
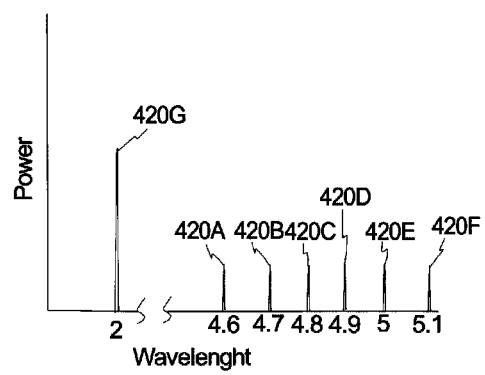
FIG. 5 is a simplified illustration of the wavelengths of an output beam having features of the present invention.

FIG. 5 is a graph that illustrates one non-exclusive example of the wavelengths that can be generated by the laser source assembly 410 (illustrated in FIGS. 4A-4C). In this embodiment, six of the beams 420A-420F have a center wavelength in the mid infrared range, and one of the beams 420G has a center wavelength outside the mid infrared range.

Figure 6:
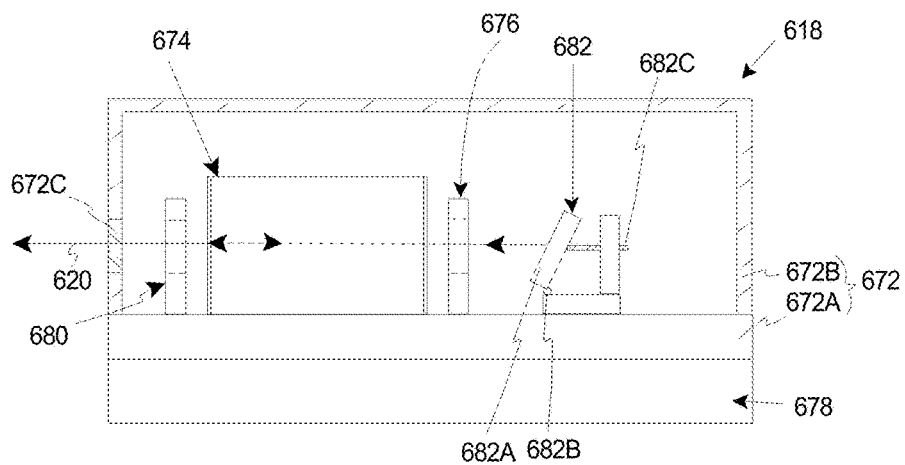
FIG. 6 is a cut-away view of a laser source having features of the present invention.

FIG. 6 is a simplified cut-away view of one non-exclusive example of a laser source 618 that can be used in any of the laser source assemblies disclosed herein. In this embodiment, the laser source 618 is an external cavity (EC), narrow linewidth, quantum cascade laser (QCL). With this design, the output beam 620 from this laser source 618 can be characterized by near-diffraction limited divergence, narrow linewidth and specific wavelength in mid to far infrared spectral range. Further, the laser source 618 provides stable, predictable spectral emission that does not drift over time.

In FIG. 6, the laser source 618 includes a source frame 672, a quantum cascade ("QC") gain media 674, a cavity optical assembly 676, a temperature controller 678, an output optical assembly 680, and a wavelength dependant ("WD") feedback assembly 682 that cooperate to generate the fixed, output beam 620. The design of each of these components can be varied pursuant to the teachings provided herein. In should be noted that the laser source 618 can be designed with more or fewer components than described above.

In FIG. 6, the source frame 672 is generally rectangular shaped and includes a mounting base 672A, and a cover 672B. Alternatively, for example, the source frame 672 can be designed without the cover 672B and/or can have a configuration different from that illustrated in FIG. 6.

The mounting base 672A provides a rigid platform for fixedly mounting the QC gain media 674, the cavity optical assembly 676, the output optical assembly 680 and the WD feedback assembly 682. In one embodiment, the mounting base 672A is a monolithic structure that provides structural integrity. In certain embodiments, the mounting base 672A is made of rigid material that has a relatively high thermal conductivity. In one non-exclusive embodiment, the mounting base 672A has a thermal conductivity of at least approximately 170 watts/meter K. With this design, in addition to rigidly supporting the components, the mounting base 672A also readily transfers heat away from the QC gain media 674 to the temperature controller 678. For example, the mounting base 672A can be fabricated from a single, integral piece of copper, copper-tungsten or other material having a sufficiently high thermal conductivity. The one piece structure of the mounting base 672A maintains the fixed relationship of the components mounted thereto and contributes to the small size and portability of the MIR laser source 10.

In FIG. 6, the cover 672B is shaped somewhat similar to an inverted, open rectangular box, and the cover 672B can include a transparent window 672C that allows the beam 620 to pass through the cover 672B. In one embodiment, the cover 672B is hermetically sealed to the mounting base 672A in an air tight manner. This allows the source frame 672 to provide a controlled environment around some of the components. For example, a cover cavity can be filled with a fluid such as nitrogen or an air/nitrogen mixture to keep out moisture and humidity; or the cover cavity can be subjected to a vacuum.

The QC gain media 674 is a unipolar semiconductor laser that includes a series of energy steps built into the material matrix while the crystal is being grown. With this design, electrons transmitted through the QC gain media 674 emit one photon at each of the energy steps. In one embodiment, the QC gain media 674 uses two different semiconductor materials such as InGaAs and AlInAs (grown on an InP or GaSb substrate for example) to form a series of potential wells and barriers for electron transitions. The thickness of these wells/barriers determines the wavelength characteristic of the QC gain media 674. Fabricating the QC gain media of different thickness enables production of the laser having different output frequencies within the mid infrared range.

It should be noted that fine tuning of the beam 620 may be achieved by controlling the temperature of the QC gain media 674, such as by changing the DC bias current. Such temperature tuning is relatively narrow and may be used to vary the wavelength by approximately 1-2 gigahertz/Kelvin which is typically less than 0.01% of the peak emission wavelength.

In the case of QC gain media 674, the "diode" has been replaced by a conduction band quantum well. Electrons are injected into the upper quantum well state and collected from the lower state using a superlattice structure. The upper and lower states are both within the conduction band. Replacing the diode with a single-carrier quantum well system means that the generated photon energy is no longer tied to the material bandgap. This removes the requirement for exotic new materials for each wavelength, and also removes Auger recombination as a problem issue in the active region. The superlattice and quantum well can be designed to provide lasing at almost any photon energy that is sufficiently below the conduction band quantum well barrier.

As used herein, the term QC gain media 674 shall also include Interband Cascade Lasers (ICL). ICL lasers use a conduction-band to valence-band transition as in the traditional diode laser. In one, non-exclusive embodiment, the semiconductor QCL laser chip is mounted epitaxial growth side down and a length of approximately four millimeters, a width of approximately one millimeter, and a height of approximately one hundred microns. A suitable QC gain media 674 can be purchased from Alpes Lasers, located in Switzerland. QC gain media 674 have low power requirements and can be manufactured with much higher yields, providing a dependable supply at lower costs.

In FIG. 6, the QC gain media 674 includes (i) a first facet that faces the cavity optical assembly 676 and the WD feedback assembly 682, and (ii) a second facet that faces the output optical assembly 680. In this embodiment, the QC gain media 674 emits from both facets.

In one embodiment, the first facet is coated with an anti-reflection ("AR") coating and the second facet is coated with a reflective coating. The AR coating allows light directed from the QC gain media 674 at the first facet to easily exit the QC gain media 674 and allows the light reflected from the WD feedback assembly 682 to easily enter the QC gain media 674. In contrast, the reflective coating reflects at least some of the light that is directed at the second facet from the QC gain media 674 back into the QC gain medium 674. In one non-exclusive embodiment, the AR coating can have a reflectivity of less than approximately 2 percent, and the reflective coating can have a reflectivity of between approximately 2-95 percent. In this embodiment, the reflective coating acts as an output coupler for the external cavity.

The QC gain media 674 generates a relatively strong output IR beam and also generates quite a bit of heat. Accordingly, the temperature controller 678 can be an important component that is needed to remove the heat, thereby permitting long lived operation.

The cavity optical assembly 676 is positioned between the QC gain media 674 and the WD feedback assembly 682 along the lasing axis (along the X axis in Figures), and collimates and focuses the light that passes between these components. For example, the cavity optical assembly 676 can include one or more lens. For example, the lens can be an aspherical lens having an optical axis that is aligned with the lasing axis.

The temperature controller 678 can be used to control the temperature of the QC gain media 674, the mounting base 672A, and/or one or more of the other components.

The output optical assembly 680 is positioned between the QC gain media 674 and the window 672C in line with the lasing axis; and the output optical assembly 680 collimates and focuses the light that exits the second facet of the QC gain media 674. For example, the output optical assembly 680 can include one or more lens that can be somewhat similar in design to the lens of the cavity optical assembly 676.

The WD feedback assembly 682 reflects the light back to the QC gain media 674 along the lasing axis, and is used to precisely adjust the lasing frequency of the external cavity and the wavelength of the beam 620. In this manner, the beam 620 may be tuned and set to a desired fixed wavelength with the WD feedback assembly 682 without adjusting the QC gain media 674. Thus, in the external cavity arrangements disclosed herein, the WD feedback assembly 682 dictates what wavelength will experience the most gain and thus dominate the wavelength of the beam 620.

In certain embodiments, the WD feedback assembly 682 includes a wavelength dependent ("WD") reflector 682A that cooperates with the reflective coating on the second facet of the QC gain media 674 to form the external cavity. Further, the WD reflector 682A can be tuned to adjust the lasing frequency of the external cavity, and the relative position of the WD feedback assembly 682 can be adjusted to tune the laser source 618 to generate the beam 620 that is fixed at a precisely selected specific wavelength in the mid to far infrared range.

In alternative, non-exclusive embodiments, the WD feedback assembly 682 can be used to control the fixed wavelength of beam 620 within approximately 0.1, 0.01, 0.001, or 0.0001 microns. In certain embodiments, with the designs provided herein, the beam 620 has a relatively narrow line width. In non-exclusive examples, the laser source 618 can be designed so that the line width of the beam 620 is less than approximately 6, 5, 4, 3, 2, 1, 0.8, 0.5, or 0.1 cm-1. Alternatively, the laser source 618 can be designed so that the line width of the beam 620 is greater than approximately 7, 8, 9, or 10 cm-1. The spectral width of the beam 620 can be adjusted by adjusting the cavity parameters of the external cavity. For example, the spectral width of the beam 620 can be increased by decreasing wavelength dispersion of intracavity wavelength selector.

The design of the WD feedback assembly 682 and the WD reflector 682A can vary pursuant to the teachings provided herein. Non-exclusive examples of a suitable WD reflector 682A includes a diffraction grating, a MEMS grating, prism pairs, a thin film filter stack with a reflector, an acoustic optic modulator, or an electro-optic modulator. A more complete discussion of these types of WD reflectors 682A can be found in the Tunable Laser Handbook, Academic Press, Inc., Copyright 1995, chapter 8, Pages 349-435, Paul Zorabedian.

The type of adjustment done to the WD reflector 682A to adjust the lasing frequency of the external cavity and the wavelength of the beam 620 will vary according to the type of WD reflector 682A. For example, if the WD reflector 682A is a diffraction grating, rotation of the diffraction grating relative to the lasing axis and the QC gain media 674 adjusts the lasing wavelength and the wavelength of the beam 620. There are many different ways to precisely rotate and fix the position of the diffraction grating.

In FIG. 6, the WD feedback assembly 682 includes a pivot 682B (e.g. a bearing or flexure) that secures WD reflector 682A to the source frame 672, and an adjuster 682C (e.g. a threaded screw) that can be rotated (manually or electrically) to adjust the angle of the WD reflector 682A.

It should be noted that the position of the WD reflector 682 can be adjusted during manufacturing to obtain the desired wavelength of the beam 620.

Further, it should be noted that the laser source 618 is tunable to a small degree by changing the temperature of the QC gain media 674 with the temperature controller 678 or by variation of the input current to the QC gain media 674.

Figure 7:
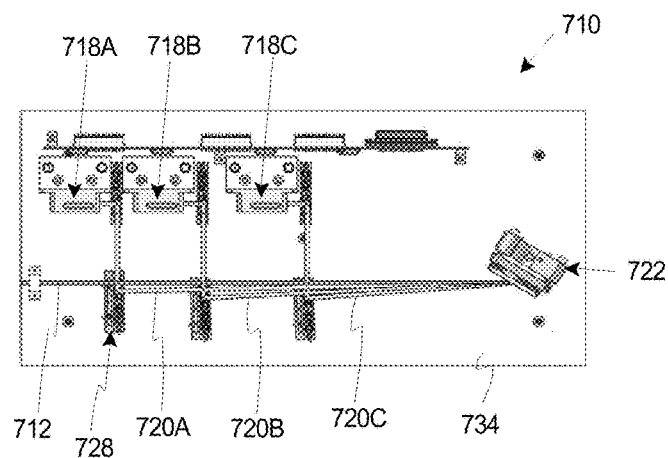
FIG. 7 is a simplified schematic of still another embodiment of a laser source assembly having features of the present invention.

FIG. 7 is a simplified top view of a prototype that was built of a laser source assembly 710 including the mounting base 734, three laser sources 718A-718C that generate beams 720A-720C, the dispersive beam combiner 722, and the beam director assembly 728 that redirects the beams 720A-720C at the proper angles at the dispersive beam combiner 722 so that the beams 720A-720C co-propagate to form the output beam 712. The laser sources 718A-718C, the dispersive beam combiner 722, and the beam director assembly 728 are similar to the corresponding components described above and illustrated in FIG. 3.

In this embodiment, the laser sources 718A-718C can be individually tuned so that a center wavelength of each laser source 718A-718C is different. Further, the beam director assembly 728 redirects the beams 720A-720C so that each beam 720A-720C impinges at a different angle on the dispersive beam combiner 722. In this example, the dispersive beam combiner 722 diffracted over eighty-five percent of each beam 720A-702C into the spatial output beam 712.

Figure 8:
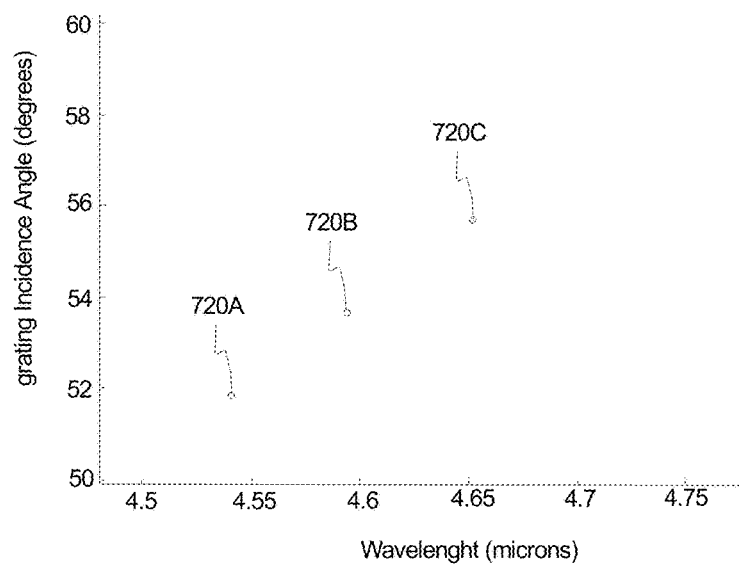
FIG. 8 is a graph that illustrates one example of three selected beams generated by the laser source assembly of FIG. 7.

In one embodiment, the three laser sources 718A-718C generate beams 720A-720C having a different center wavelength that corresponds to low absorption windows in the atmosphere between four and one-half and five microns. FIG. 8 illustrates one non-exclusive example of the three selected wavelengths of the beams 720A-720C of the laser sources 718A-718C (illustrated in FIG. 7) that were selected in the low absorption windows. FIG. 8 also illustrates the corresponding incidence angle on the grating in which each beam 720A-720C is directed at the dispersive beam combiner 722 (illustrated in FIG. 7) so that the beams 720A-720C co-propagate to form the output beam 712 (illustrated in FIG. 7).

The figure of merit for evaluating the diffraction limitedness of a beam is denoted by $M^2$, and $M^2$ equals one for a perfect beam. A non perfect beam has a $M^2$ value that is greater than one. Measuring a beam's diameter as a function of distance yields this $M^2$ parameter. In non-exclusive prototype illustrated in FIG. 7, each of the individual laser beams 720A-720C had $M^2$ numbers of approximately 1.15, and the resulting combined output beam 712 had an $M^2$ value of approximately 1.2 and low divergence.

Figure 9:
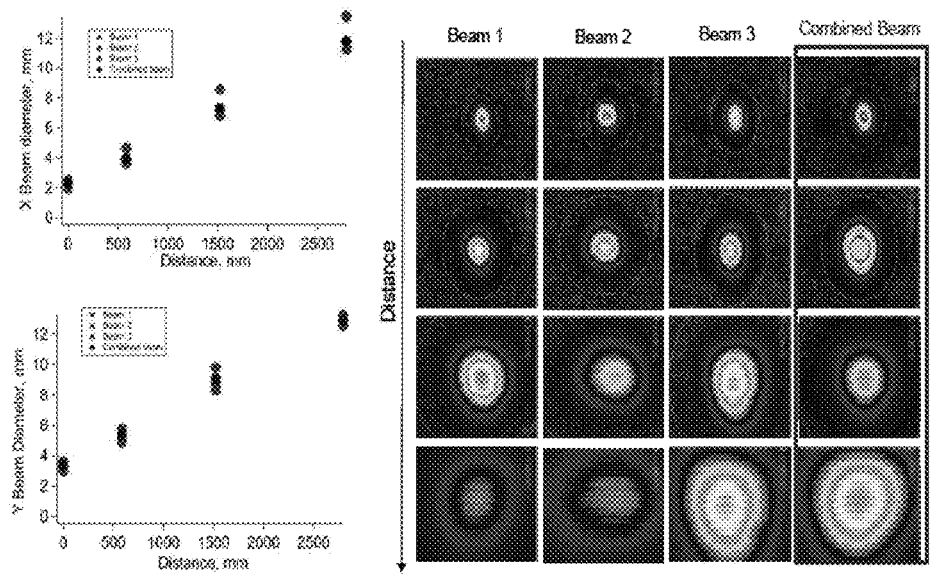
FIG. 9 illustrates the profiles for the beams generated by the laser source assembly of FIG. 7.

FIG. 9 illustrates the beam profiles as a function of distance for the three individual beams 720A-720C (illustrated in FIG. 7) and the combined output beam 712 (illustrated in FIG. 7) for the laser source assembly 710 (illustrated in FIG. 7).

As provided herein, gratings and prisms represent the simplest beam dispersive beam combiners 222, 322, 422, 722. However, more complex dispersive beam combiners could be utilized. For example, the dispersive beam combiner can include additional optics, that, for example, address the fact that beams with small wavelength differences have to impinge on a dispersive element at very similar angles. Having a dispersive beam combiner that takes in these beams at greater incremental angles could greatly help reduce the size and complexity of the beam director assembly.

Figure 10:
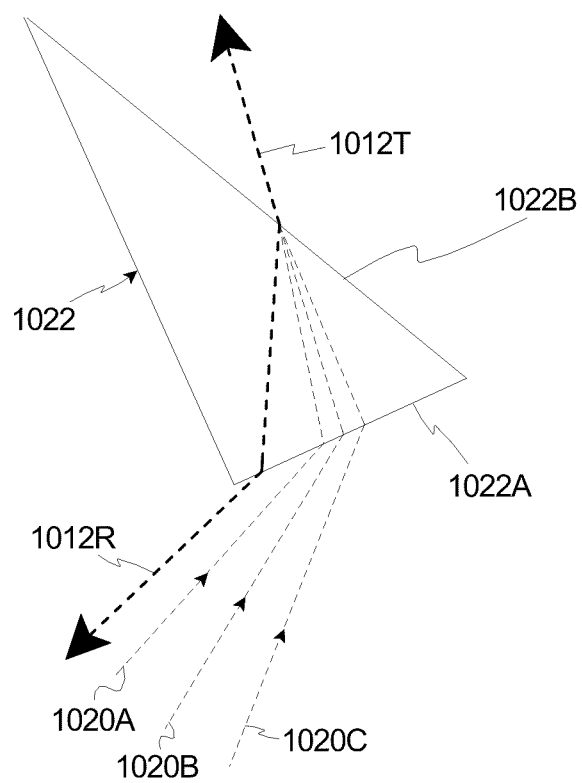
FIG. 10 is a simplified illustration of a beam director assembly and a beam combiner having features of the present invention.

FIG. 10 illustrates three beams 1020A-1020C and another embodiment of a dispersive beam combiner 1022 that combines the beams. In this embodiment, the dispersive beam combiner 1022 is a grism that includes a prism 1022A and a grating 1022B that is positioned on one side of the prism 1022A. In this embodiment, the three beams 1020A-1020C are directed at the prism 1022A, which directs the three beams 1020A-1020C at the grating 1022B. Stated in another fashion, the beams 1020A-1020C enter the prism 1022A medium through the optically flat side and then impinge on the grating 1022B from inside of the prism 1022A.

In this embodiment, if the grating 1022B is transmissive, the beams 1020A-1020C will co-propagate through the grating 1022B to form the output beam 1012T. Alternatively, in this embodiment, if the grating 1022B is reflective, the beams 1020A-1020C will be reflect off of the grating 1022B to form the output beam 1012R that is transmitted back through the prism 1022A.

It should be noted that in FIG. 10, because of the use of the prism 1022A, the differences in angle of incidence in which the beams 1020A-1020C impinge on the prism 1022A can be relatively large, while still achieving relatively small differences in angle of incidence on the grating 1022B. With this design, beams 1022A-1022C with small wavelength differences can be directed at the prism 1022A with larger differences in angle of incidence on the prism 1022A, while still achieving the necessary, relatively small differences in angle of incidence on the grating 1022B. The greater the index of refraction of the material for the prism 1022A, the smaller the delta angles between the beams 1020A-1020C at the grating 1022B. For infrared wavelengths, transparent materials such as silicon, germanium or zinc selenide can be used for the prism 1022A.

Figure 11:
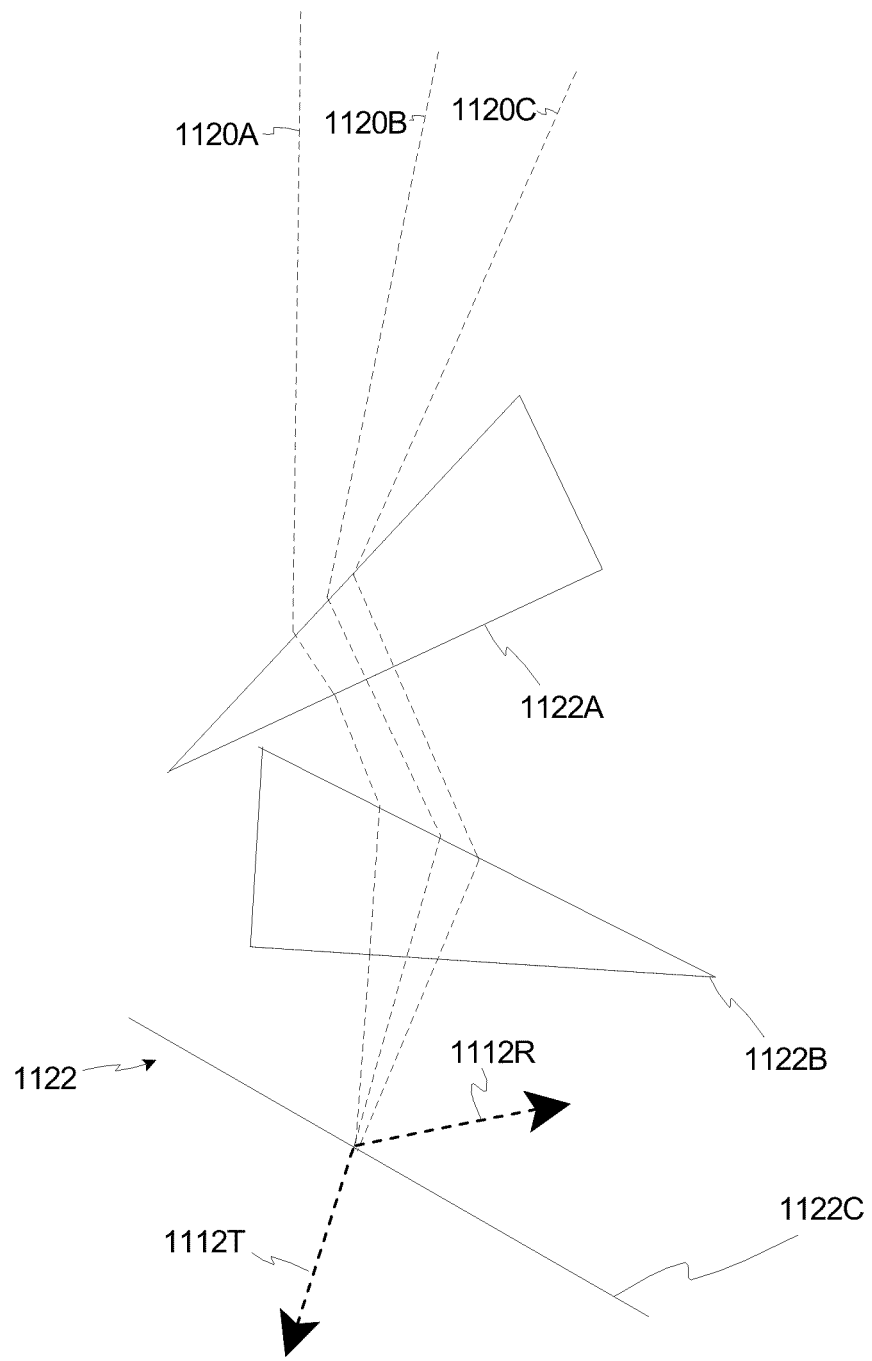
FIG. 11 is a simplified illustration of another embodiment of a beam director assembly and a beam combiner having features of the present invention.

FIG. 11 illustrates three beams 1120A-1120C and another embodiment of a dispersive beam combiner 1122 that combines the beams. In this embodiment, the dispersive beam combiner 1122 includes a first anamorphic prism 1122A, a second anamorphic prism 1122B that is spaced apart from the first anamorphic prism 1122A, and a grating 1122C that is spaced apart from the anamorphic prisms 1122A, 1122B.

In this embodiment, the three beams 1120A-1120C are directed at the first anamorphic prism 1122A, which transmits and directs the three beams 1120A-1120C at the second anamorphic prism 1122A. Next, the second anamorphic prism 1122A transmits and directs the three beams 1120A-1120C at the grating 1122C.

In this embodiment, if the grating 1122C is transmissive, the beams 1120A-1120C will co-propagate through the grating 1122C to form the output beam 1112T. Alternatively, in this embodiment, if the grating 1122C is reflective, the beams 1120A-1120C will be reflect off of the grating 1122C to form the output beam 1112R.

In FIG. 11, because of the use of the prisms 1122A, 1122B, the differences in angle of incidence in which the beams 1120A-1120C impinge on the first prism 1122A can be relatively large, while still achieving a relatively small differences in angle of incidence on the grating 1122C. With this design, beams 1122A-1122C with small wavelength differences can be directed at the first prism 1122A with larger differences in angle of incidence on the first prism 1122A, while still achieving the necessary, relatively small differences in angle of incidence on the grating 1122C.

Figure 12A:
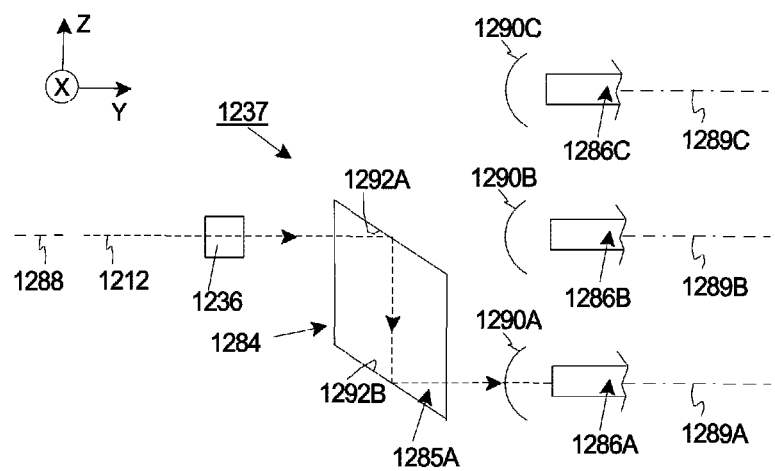
FIG. 12A is a simplified side illustration of a portion of the optical fiber switch having features of the present invention, with a redirector of the optical fiber switch positioned in a first position.
Figure 12B:
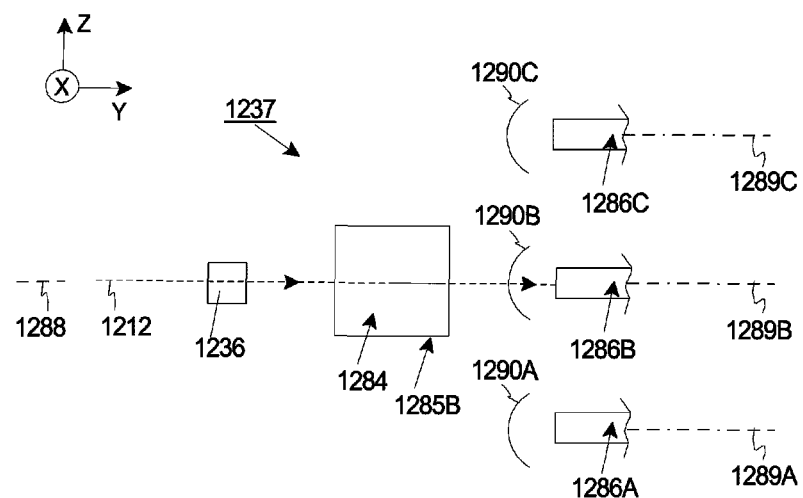
FIG. 12B is a simplified side illustration of the portion of the optical fiber switch with the redirector positioned in a second position.
Figure 12C:
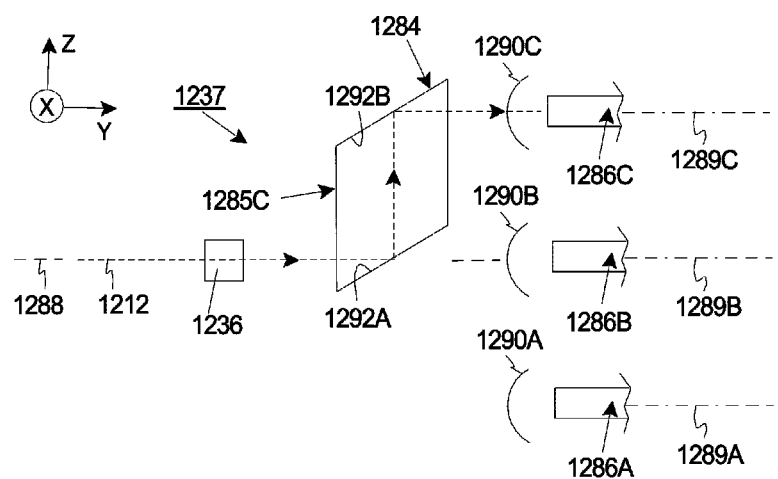
FIG. 12C is a simplified side illustration of the portion of the optical fiber switch with the redirector positioned in a third position.

FIG. 12A is a simplified side illustration of an optical fiber switch 1237 having features of the present invention with a redirector 1284 positioned in a first position 1285A; FIG. 12B is a simplified side illustration of the optical fiber switch 1237 with the redirector 1284 positioned in a second position 1285B that is different from the first position 1285A; and FIG. 12C is a simplified side illustration of the optical fiber switch 1237 with the redirector 1284 positioned in a third position 1285C that is different from the first position 1285A and the second position 1285B. It should be noted that a switch housing, and a motor that selectively rotates the redirector 1284 between the positions 1285A-1285C are not shown so that the other components of the optical fiber switch 1237 are visible. In this embodiment, the optical fiber switch 1237 selectively directs the assembly output beam 1212 to each of the output fibers 1286A, 1286B, 1286C. It should be noted that the optical fiber switch 1237 can be designed to selectively direct the beam 1212 to more than three or fewer than three output fibers 1286A, 1286B, 1286C.

FIGS. 12A-12C illustrate that the optical fiber switch 30 includes a lens 1236 that focuses the beam 1212 along an input axis 1288 at the redirector 1284. In this embodiment, the redirector 1284 redirects the input beam 1212 so that the beam 1212 (i) launches from the redirector 1284 along a first redirected axis 1289A that is spaced apart from the input axis 1288 when the redirector 1284 is positioned at the first position 1285A as illustrated in FIG. 12A; (ii) launches from the redirector 1284 along a second redirected axis 1289B that is spaced apart from the input axis 1288 when the redirector 1284 is positioned at the second position 1285B as illustrated in FIG. 12B; and (iii) launches from the redirector 1284 along a third redirected axis 1289C that is spaced apart from the input axis 1288 when the redirector 1284 is positioned at the third position 1285C as illustrated in FIG. 3C.

In this embodiment, the redirected axes 1289A, 1289B, 1289C are parallel to the input axis 1288, and are each offset an equal distance away from the input axis 1288. In FIGS. 12A-12C, (i) a first fiber inlet of the first output fiber 1286A is positioned along the first redirected axis 1289A; (ii) a second fiber inlet of the second output fiber 1286B is positioned along the second redirected axis 1289B; and (iii) a third fiber inlet of the third output fiber 1286C is positioned along the third redirected axis 1289C.

Additionally, the optical fiber switch 1237 can include (i) a first coupling lens 1290A that is positioned on the first redirected axis 1289A between the redirector 1284 and the first fiber 1286A when the redirector 1284 is in the first position 1285A; (ii) a second coupling lens 1290B that is positioned on the second redirected axis 1289B between the redirector 1284 and the second fiber 1286B when the redirector 1284 is in the second position 1285B; and (iii) a third coupling lens 1290C that is positioned on the third redirected axis 1289C between the redirector 1284 and the third fiber 1286C when the redirector 1284 is in the third position 1285C.

The design of the redirector 1284 can be varied pursuant to the teachings provided herein. In one embodiment, the redirector 1284 includes an input reflective surface 1292A (e.g. a mirror) that is positioned in the path of the output beam 1212, and an output reflective surface 1292B (e.g. a mirror) that is substantially parallel to (in parallel planes) and spaced apart from the input reflective surface 1292A along a redirector longitudinal axis that is perpendicular to the input axis 1288. In this embodiment, each reflective surface 1292A, 1292B is adapted to reflect the beam 1212. For example, the input reflective surface 1292A can redirect the input beam 1212 approximately ninety degrees, and the output reflective surface 1292B can also redirect the beam 1212 approximately ninety degrees. With this design, in this embodiment, the redirected beam is parallel and spaced apart from the input beam 1212. Moreover, the input reflective surface 1292A can be fixedly coupled to the second reflective surface 1292B so that they are moved concurrently during movement of the redirector 1284.

A more detailed discussion of an optical fiber switch is provided in U.S. application Ser. No. 12/780,575, filed on May 14, 2010, and entitled "Optical Fiber Switch". As far as permitted, the contents of U.S. application Ser. No. 12/780, 575 are incorporated herein by reference.

While the particular designs as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A laser source assembly for providing an assembly output beam, the laser source assembly comprising:
   a first laser source that emits a first beam having a first center wavelength;
   a second laser source that emits a second beam having a second center wavelength that is different than the first center wavelength; and
   a dispersive beam combiner that combines the first beam and the second beam to provide the assembly output beam; wherein the first beam impinges on a common area of the dispersive beam combiner at a first beam angle, and wherein the second beam impinges on the common area at a second beam angle that is different than the first beam angle; and wherein the beams exiting from the dispersive beam combiner are substantially coaxial; and
   a reflective beam director assembly that reflects the first beam so that the first beam impinges on the common area at the first angle, and that reflects the second beam so that the second beam impinges on the common area at the second angle.

2. The laser source assembly of claim 1 wherein the first laser source includes an adjustable, first wavelength dependent feedback assembly that is adjusted to select the first center wavelength; and wherein the second laser source includes an adjustable, second wavelength dependent feedback assembly that is adjusted to select the second center wavelength.

3. The laser source assembly of claim 1 wherein the first center wavelength and the second center wavelength are in the mid to far infrared range.

4. The laser source assembly of claim 1 wherein the assembly output beam has a figure of merit $M^2$ of approximately 1.2.

5. The laser source assembly of claim 1 further comprising an optical switch, and a lens that focuses the assembly output beam on an inlet to the optical switch.

6. The laser source assembly of claim 1 wherein the dispersive beam combiner includes a grating which combines the first beam and the second beam.

7. The laser source assembly of claim 6 further comprising a prism that directs the beams at the grating.

8. The laser source assembly of claim 1 further comprising a third laser source that emits a third beam having a third center wavelength that is different than the first center wavelength and the second center wavelength; wherein the dispersive beam combiner that combines the first beam, the second beam, and the third beam to provide the assembly output beam; wherein the third beam impinges on the common area of dispersive beam combiner at a third beam angle that is different than the first beam angle and the second beam angle.

9. A missile jamming system for jamming an incoming missile, the missile jamming system comprising the laser source assembly of claim 1 directing the assembly output beam at the incoming missile.

10. A method for generating an assembly output beam, the method comprising the steps of:
    emitting a first beam with a first laser source, the first beam having a first center wavelength;
    emitting a second beam with a second laser source, the second beam having a second center wavelength that is different than the first center wavelength; and
    providing a dispersive beam combiner that has a common area;
    reflecting the first beam so that the first beam impinges on the common area at a first beam angle, and reflecting the second beam so that the second beam impinges on the common area at a second beam angle that is different from the first beam angle; and
    combining the first beam and the second beam with the dispersive beam combiner to provide the assembly output beam; wherein the beams exiting from the dispersive beam combiner are substantially coaxial.

11. The method of claim 10 wherein the step of emitting a first beam includes adjusting a first wavelength dependent feedback assembly of the first laser source to adjust the first center wavelength, and wherein the step of emitting a second beam includes adjusting a second wavelength dependent feedback assembly of the second laser source to adjust the second center wavelength.

12. The method of claim 10 wherein the assembly output beam has a figure of merit $M^2$ of less than approximately 1.2.

13. The method of claim 10 further comprising the step of focusing the assembly output beam on an inlet of an optical switch.

14. The method of claim 10 wherein the step of combining includes the dispersive beam combiner having a grating which combines the first beam and the second beam.

15. The method of claim 14 further comprising the step of directing the beams at the grating with a prism.

16. The method of claim 10 further comprising the step of emitting a third beam with a third laser source, the third beam having a third center wavelength that is different than the first center wavelength and the second center wavelength, and wherein the step of combining includes combining the first beam, the second beam and the third beam with the dispersive beam combiner to provide the assembly output beam; wherein the third beam impinges on the common area at a third beam angle that is different from the first beam angle and the second beam angle.

17. The method of claim 10 wherein the step of emitting a first beam includes the first beam being in the mid to far infrared range, and wherein the step of emitting a second beam includes the second beam being in the mid to far infrared range.

18. The laser source assembly of claim 1 wherein the reflective beam director assembly includes (i) a pair of spaced apart first beam directors that are independently adjustable to reflect and redirect the first beam so that the first beam impinges on the common area at the first angle, and (ii) a pair of spaced apart second beam directors that are independently adjustable to reflect and redirect the second beam so that the second beam impinges on the common area at the second angle.

19. The laser source assembly of claim 1 wherein the first laser source includes a first temperature controller that controls the temperature of the first laser source, and the second laser source includes a second temperature controller that controls the temperature of the second laser source.

20. A laser source assembly for providing an assembly output beam, the laser source assembly comprising:
a first laser source that emits a first beam having a first center wavelength;
a second laser source that emits a second beam having a second center wavelength that is different than the first center wavelength;
a third laser source that emits a third beam having a third center wavelength that is different than the first center wavelength and the second center wavelength; and
a dispersive beam combiner that combines the first beam, the second beam, and the third beam to provide the assembly output beam; wherein the first beam impinges on a common area of the dispersive beam combiner at a first beam angle, wherein the second beam impinges on the common area at a second beam angle that is different than the first beam angle; wherein the third beam impinges on the common area of the dispersive beam combiner at a third beam angle that is different than the first beam angle and the second beam angle; and wherein the beams exiting from the dispersive beam combiner are substantially coaxial.

21. The laser source assembly of claim 20 wherein the first laser source includes an adjustable, first wavelength dependent feedback assembly that is adjusted to select the first center wavelength, the second laser source includes an adjustable, second wavelength dependent feedback assembly that is adjusted to select the second center wavelength, and the third laser source includes an adjustable, third wavelength dependent feedback assembly that is adjusted to select the third center wavelength.

22. The laser source assembly of claim 20 wherein the dispersive beam combiner includes a grating which combines the first beam, the second beam, and the third beam.

23. The laser source assembly of claim 20 further comprising a reflective beam director assembly that reflects the first beam so that the first beam impinges on the common area at the first angle, that reflects the second beam so that the second beam impinges on the common area at the second angle, and that reflects the third beam so that the third beam impinges on the common area at the third angle.

24. The laser source assembly of claim 23 wherein the reflective beam director assembly includes (i) a pair of spaced apart first beam directors that are independently adjustable to reflect and redirect the first beam so that the first beam impinges on the common area at the first angle, (ii) a pair of spaced apart second beam directors that are independently adjustable to reflect and redirect the second beam so that the second beam impinges on the common area at the second angle, and (iii) a pair of spaced apart third beam directors that are independently adjustable to reflect and redirect the third beam so that the third beam impinges on the common area at the third angle.

25. The laser source assembly of claim 20 wherein the first laser source includes a first temperature controller that independently controls the temperature of the first laser source, the second laser source includes a second temperature controller that independently controls the temperature of the second laser source, and the third laser source includes a third temperature controller that independently controls the temperature of the third laser source.

26. A missile jamming system for jamming an incoming missile, the missile jamming system comprising the laser source assembly of claim 1 directing the assembly output beam at the incoming missile.

27. A method for generating an assembly output beam, the method comprising the steps of:
emitting a first beam with a first laser source, the first beam having a first center wavelength;
emitting a second beam with a second laser source, the second beam having a second center wavelength that is different than the first center wavelength;
emitting a third beam with a third laser source, the third beam having a third center wavelength that is different than the first center wavelength and the second center wavelength; and
combining the first beam, the second beam and the third beam with a dispersive beam combiner to provide the assembly output beam; wherein the first beam impinges on a common area of dispersive beam combiner at a first beam angle; wherein the second beam impinges on the common area at a second beam angle that is different than the first beam angle; wherein the third beam impinges on the common area at a third beam angle that is different from the first beam angle and the second beam angle; and wherein the beams exiting from the dispersive beam combiner are substantially coaxial.

* * * * *

UNITED STATES PATENT AND TRADEMARK OFFICE
CERTIFICATE OF CORRECTION

PATENT NO. : 8,565,275 B2
APPLICATION NO. : 13/177332
DATED : October 22, 2013
INVENTOR(S) : Michael Pushkarsky et al.

Page 1 of 1

It is certified that error appears in the above-identified patent and that said Letters Patent is hereby corrected as shown below:

In the Claims:

Column 17, line 40, delete "and".
Column 18, line 29, delete "and".

Signed and Sealed this
Third Day of December, 2013

Margaret A. Focarino
*Commissioner for Patents of the United States Patent and Trademark Office*